(12) United States Patent
Oppenländer et al.

(10) Patent No.: US 7,369,093 B2
(45) Date of Patent: May 6, 2008

(54) SUPERCONDUCTING QUANTUM ANTENNA

(75) Inventors: Jörg Oppenländer, Kirchentellinsfurt (DE); Christoph Häussler, Gomaringen (DE); Nils Schopohl, Reutlingen (DE); Alexander Friesch, Tübingen (DE); Jörg Tomes, Tübingen (DE)

(73) Assignee: Qest Quantenelektronische Systeme GmbH, Reutlingen (DE)

( * ) Notice: Subject to any disclaimer, the term of this patent is extended or adjusted under 35 U.S.C. 154(b) by 117 days.

(21) Appl. No.: 11/299,308

(22) Filed: Dec. 9, 2005

(65) Prior Publication Data

US 2006/0145694 A1    Jul. 6, 2006

Related U.S. Application Data

(63) Continuation of application No. PCT/DE2004/001209, filed on Jun. 14, 2004.

(30) Foreign Application Priority Data

Jun. 13, 2003   (DE)   ................................ 103 27 061

(51) Int. Cl.
*H01Q 13/00*   (2006.01)
*H01Q 1/38*   (2006.01)
*H01Q 1/42*   (2006.01)

(52) U.S. Cl. ............................. 343/772; 343/700 MS; 343/872

(58) Field of Classification Search ......... 343/700 MS, 343/772, 729, 900, 872
See application file for complete search history.

(56) References Cited

U.S. PATENT DOCUMENTS 6,363,268 B1    3/2002   Martin et al. ............... 505/201
6,690,162 B1 *  2/2004   Schopohl et al. ........... 324/248

FOREIGN PATENT DOCUMENTS

| JP | 04-002979 A1 | 1/1992 |
| JP | 2003-023362 | 1/2003 |
| WO | WO 99/06777 A1 | 2/1999 |
| WO | WO 01/25805 A1 | 4/2001 |

\* cited by examiner

*Primary Examiner*—Shih-Chao Chen
(74) *Attorney, Agent, or Firm*—Burr & Brown

(57) ABSTRACT

An antenna for electromagnetic waves including a quantum interference filter, at least one low-temperature transistor and primary antenna structures, means for deriving an electromagnetic wave from the circuit, cooling elements and insulating means. The interference filter and the transistor act as active components, the primary antenna structure is connected up to at least one of the active components in such a way that upon incidence of an electromagnetic wave on the primary antenna structure there is present at the output of the at least one active component a conducted electromagnetic wave, and wherein at least one part of the circuit and at least one part of the primary antenna structure are thermally insulated, the thermal insulation is frequency transparent to electromagnetic waves, and the cooling elements are designed to cool down at least one part of the circuit below the transition temperature of at least one of the superconducting materials.

41 Claims, 31 Drawing Sheets

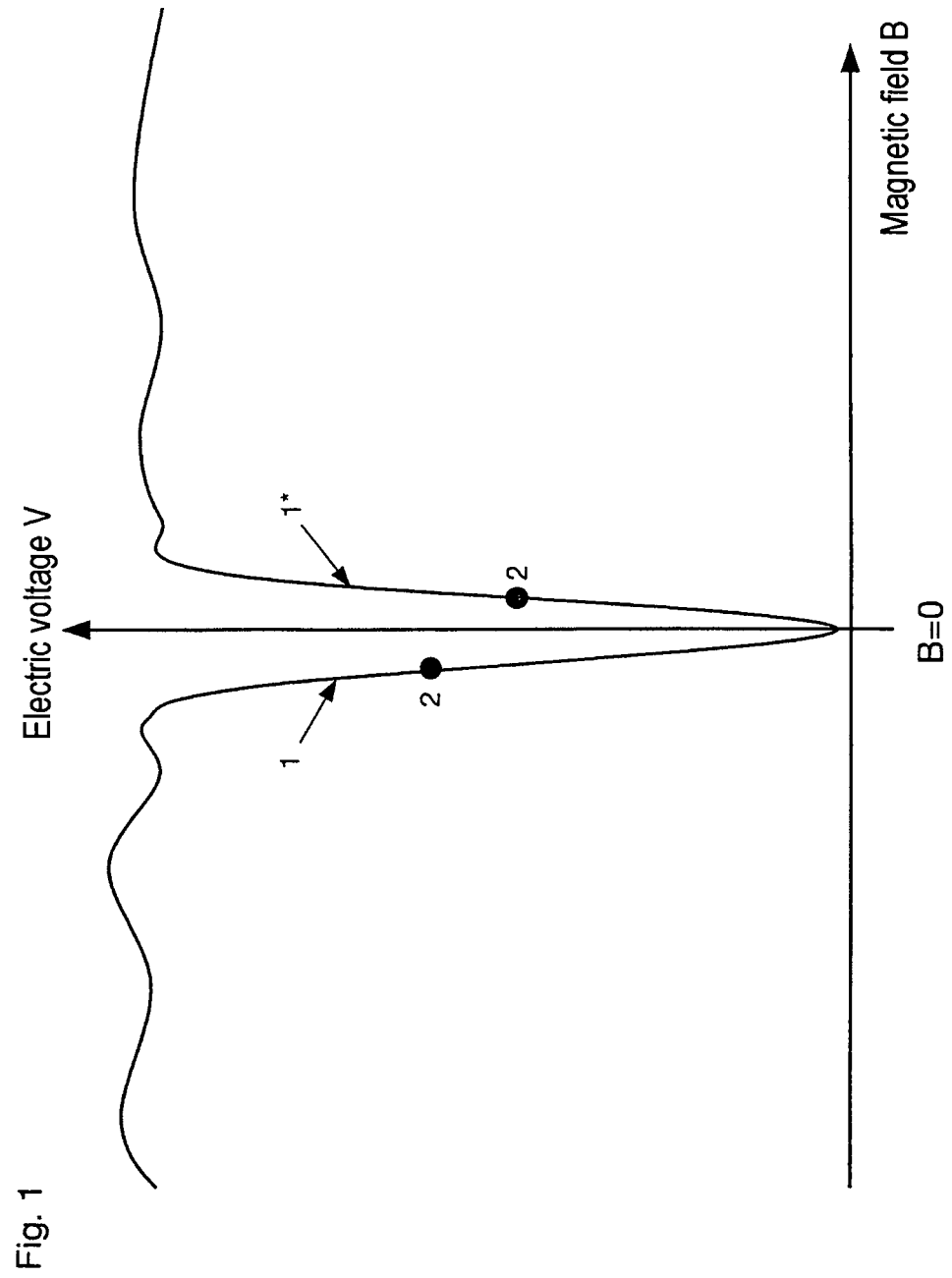

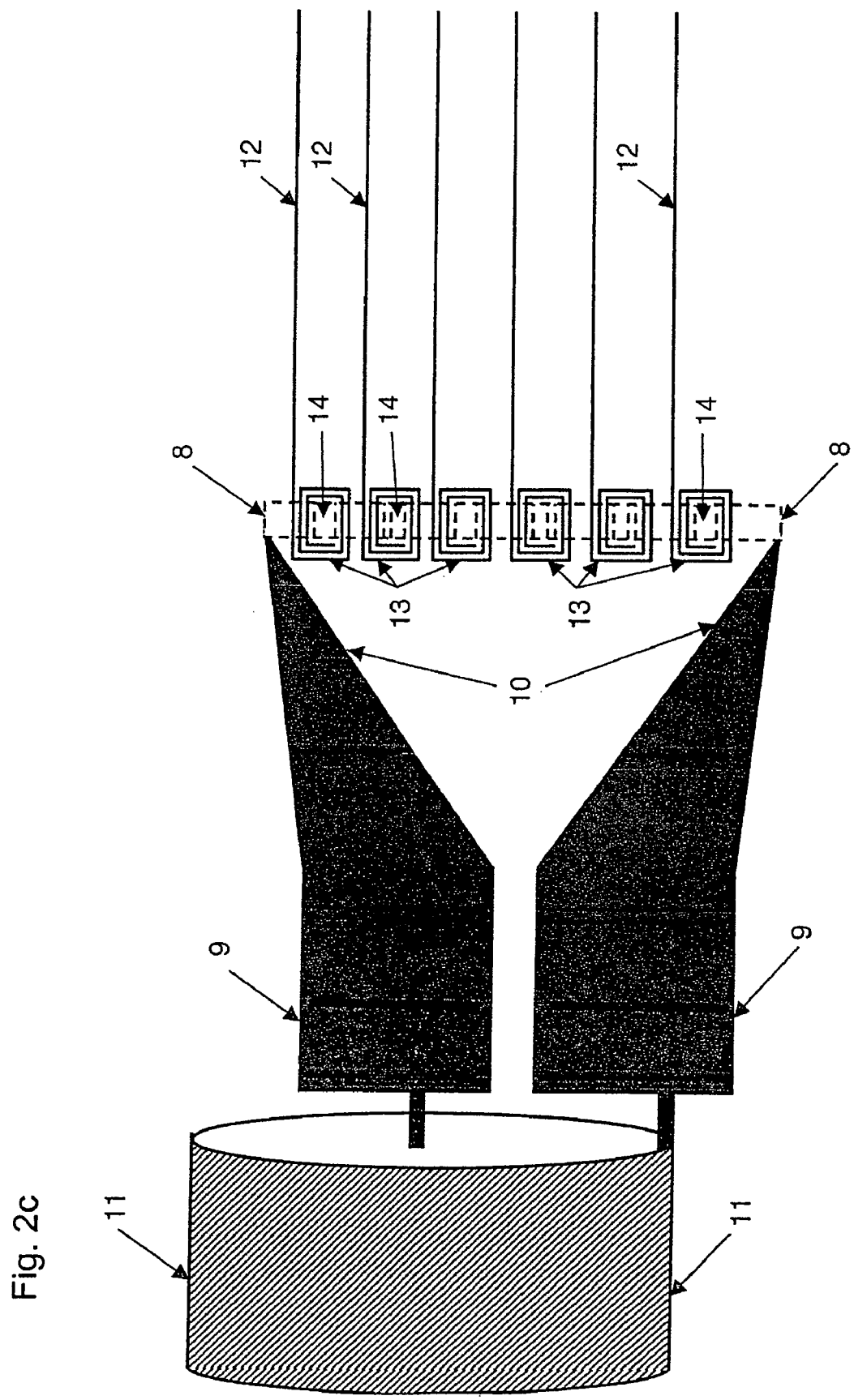

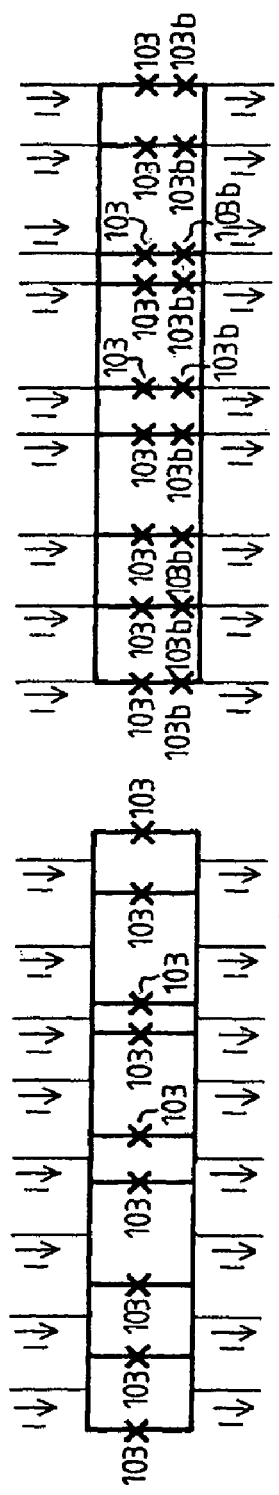
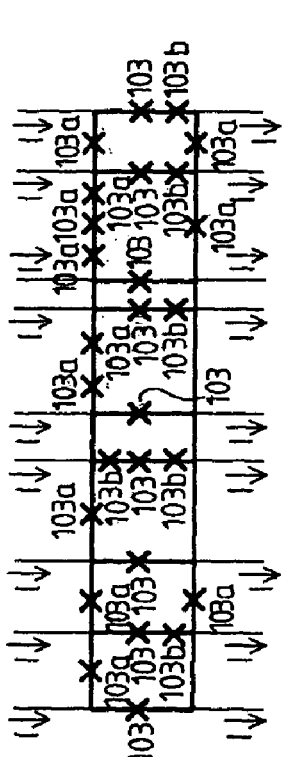
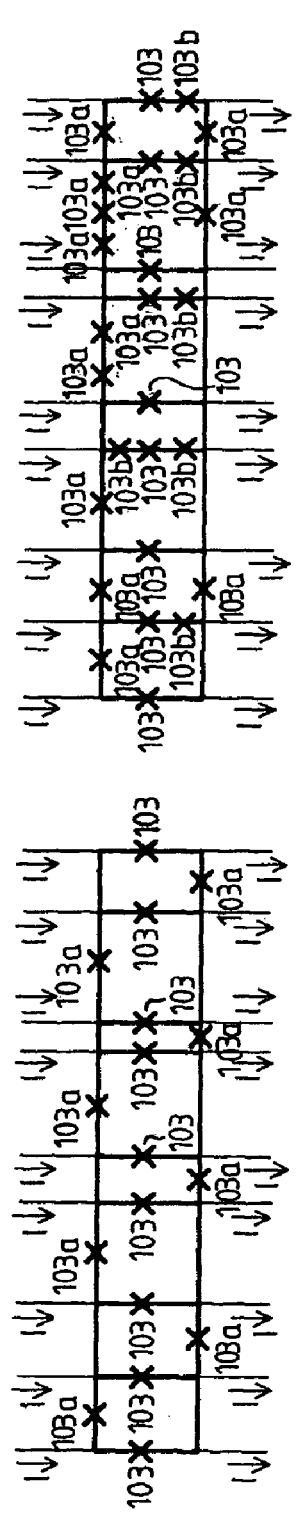
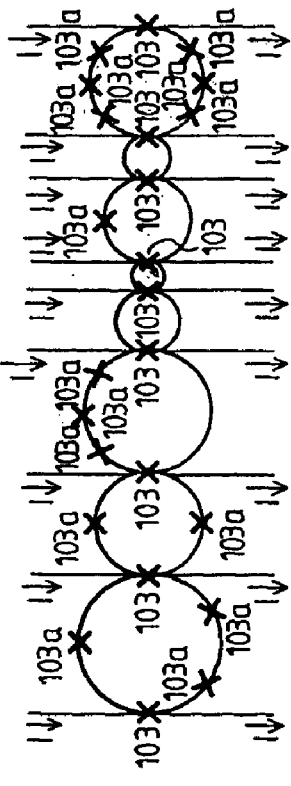
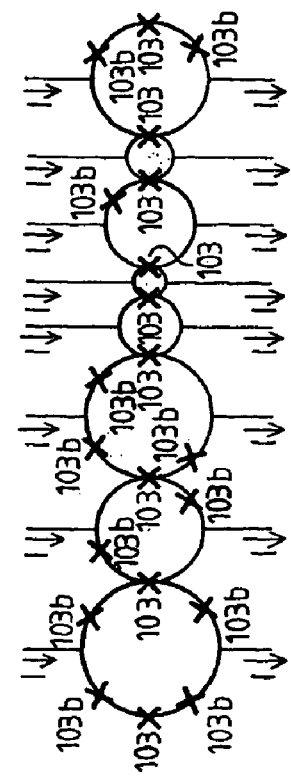
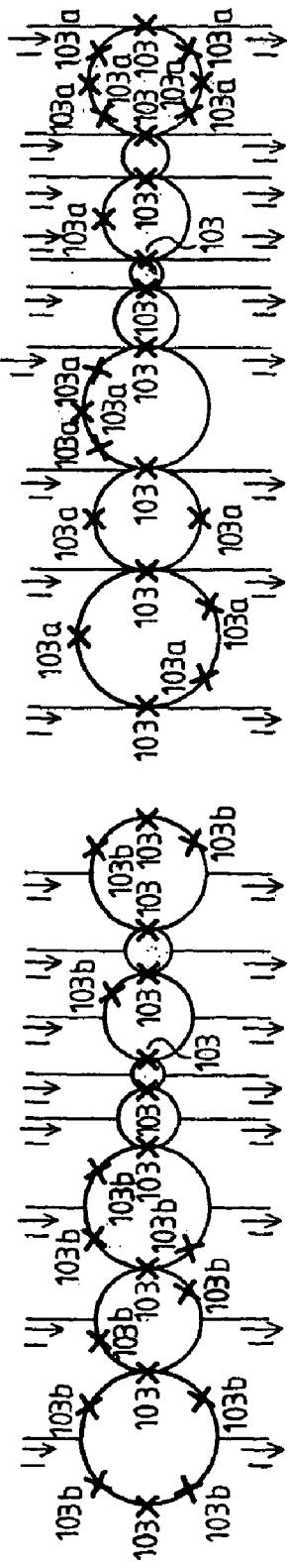

SUPERCONDUCTING QUANTUM ANTENNA

CROSS REFERENCE TO RELATED APPLICATIONS

This application is a continuation of International Application No. PCT/DE2004/001209 having an international filing date of Jun. 14, 2004, which designated the United States, the entirety of which is incorporated herein by reference.

This application also claims the benefit of German Application No. 103 27 061.2 filed Jun. 13, 2003, the entirety of which is incorporated herein by reference.

FIELD OF THE INVENTION

The present invention relates to an active highly sensitive antenna for electromagnetic waves that includes at least one superconducting quantum interference filter or at least one low temperature transistor.

BACKGROUND OF THE INVENTION

The mode of operation of conventional electric receiving antennas is based essentially on the fact that an incident electromagnetic wave induces a voltage drop across the antenna that constitutes the input signal for the receiving electronics. However, the induced voltage drop is generally so small that it must initially be amplified with the aid of resonance effects. In this case, either the conventional antenna is itself designed in such a way that a geometrical resonance occurs at the receiving frequency, or the antenna is provided with an electric balancing network such that the antenna and balancing network form a resonant circuit.

Owing to the resonance amplification required for achieving an adequate sensitivity, the frequency bandwidth within which reception is possible is severely restricted with conventional antennas. The bandwidth is typically smaller than 20% of the resonance frequency. A larger bandwidth can be achieved with the aid of so-called "frequency independent" logarithmic spiral antennas. However, even here the extent of the antenna must be in the region of the wavelength of the electromagnetic wave to be received, and the sensitivity of such antennas is mostly low.

It is true in principle that magnetic loop antennas can be designed with broader bands than electric antennas, but they cannot be used at relatively high frequencies because of the occurrence of inductive effects and because of the skin effect. Moreover, during conventional operation the impedance of magnetic loop antennas can be adapted to the impedance of conventional electronic circuits only with difficulty, and the efficiency of the antennas is thereby sharply decreased.

A further problem occurs with conventional antenna systems when electromagnetic waves of very low signal strength are to be received. The input sensitivity of conventional antenna systems is limited in principle by the noise of the preamplifier following the antenna. The input signal coming from the antenna must be above the noise threshold of the preamplifier so that it can be usefully amplified. In order to receive very small signals, it is therefore necessary with conventional receiving systems that the antenna extracts a sufficient amount of energy from the electromagnetic field. In the case of very small signal strengths, this can be achieved conventionally only by using very large antennas, parabolic mirrors or arrays of antennas, for example. In any case, the spatial extent of the antenna increases sharply here. A typical application in which small signal strengths are present, is the reception of satellite signals, for example. Here, the extent of the antenna is typically in the region of one meter.

Because of their large dimensions, antenna arrays are not suitable, or suitable only in a severely restricted way, for mobile use, in particular, for example in vehicles, ships or aircraft.

Since conventional antenna systems must extract energy from the electromagnetic field in order to process the information contained in the field, the range of transmission antennas is additionally limited in principle by the number of the receivers for a given transmitter power.

SUMMARY OF THE INVENTION

An object of the present invention is to overcome the limitations of conventional receiving antennas with regard to their sensitivity and their dimensions.

The advantages achieved with the invention reside in the fact that owing to its functional principle when using a superconducting quantum interference filter, in particular, the antenna extracts no energy, or only a very small amount thereof, from the electromagnetic field and thereby renders possible the reception of very small signals in conjunction with a very small dimension of the antenna itself. In order to achieve the sensitivity of a parabolic antenna of approximately 60 cm diameter, an inventive antenna of approximately 1 cm×1 cm is typically sufficient. In addition, the antenna can be designed such that its bandwidth is bounded only by the cutoff frequency of the superconducting quantum interference filter used. This cutoff frequency is typically in the range of 20 GHz to 100 GHz, and so appropriate bandwidths can be achieved.

A superconducting quantum interference filter has the following basic features:

- closed superconducting cells that form a current loop and in each case include a plurality, preferably two Josephson junctions,
- at least three of these cells are connected in a superconducting or non-superconducting fashion,
- the junctions of the at least three cells can be energized in such a way that a time-variant voltage drops in each case across at least two junctions of a cell, the time average of which voltage does not vanish,
- the at least three cells are configured differently geometrically in such a way that the magnetic fluxes enclosed by the cells in the case of an existing magnetic field differ from one another in such a way that the frequency spectrum of the voltage response function has no significant $\Phi_0$-periodic component with reference to the magnetic flux, or in that if a discrete frequency spectrum exists, the contribution of the $\Phi_0$-periodic component of the discrete frequency spectrum is not dominant compared to the non-periodic components of the discrete frequency spectrum.

These fundamental features of a superconducting quantum interference filter, and a multiplicity of specific forms are disclosed in DE 100 43 657 A1 and in the parallel U.S. Pat. No. 6,690,162 B1.

Specific reference is made here to the corresponding German laid-open patent application and to the US patent. A description is given herein not only of the described basic form of a superconducting quantum interference filter, also denoted below as a SQIF, but also to a multiplicity of developments corresponding to the following statements A1) to A12).

A1) With regard to the periodicity of the voltage response function, it is also possible to select the following functional approach for the SQIF: that the at least three cells are configured differently geometrically in such a way that the magnetic fluxes enclosed by the cells in the case of an existing magnetic field form a ratio to one another in such a way that the period of the voltage response function of the network with reference to the magnetic flux permeating the network cells in their entirety is greater or very much greater than the value of an elementary flux quantum and/or the voltage response no longer has a $\Phi_0$-periodic component. In the ideal case the voltage response function no longer has a period when the magnetic fluxes enclosed by the cells are not in a rational ratio to one another. In addition, the differences in area between the individual cells are preferably relatively large. In particular, in this case cells connected in a superconducting fashion are superimposed in such a way that the voltage response function no longer has a period.

Consequently, different cells are connected to one another specifically, and this is something the person skilled in the art would always want to avoid with conventional SQUID arrangements. This is expressed, for example, in the publication by HANSEN, BINSLEV J., LINDELOF P. E.: Static and dynamic interactions between Josephson junctions. In: Reviews of Modern Physics, Vol. 56, No. 3, July 1984, p. 431 to 459. On page 434, left-hand column, last paragraph and subsequently in the right-hand column, this publication favors a system with identical cells and identical junctions and, by contrast, classifies asymmetries as counterproductive for the functioning of the SQUID described in this regard.

Superconducting quantum interference filters exhibit the physical effect of multiple macroscopic quantum interference in such a way that the ambiguity of the calibration curves of conventional SQUID magnetometers and SQUID gradiometers is removed.

In a superconducting quantum interference filter, the quantum mechanical wave functions which describe the state of the superconducting solid interfere in such a way that a unique macroscopic calibration curve $\langle V(\vec{B};I_0)\rangle$ is produced. In the ideal case, the calibration curve $\langle V(\vec{B};I_0)\rangle$ of the superconducting quantum interference filter has no periodicity with the period $\Phi_0$ and is a function, rising monotonically in a specific measuring range, of the absolute value of the external magnetic field $\vec{B}$ at the location of the SQIF.

The uniqueness of the calibration curve, and the high sensitivity of superconducting quantum interference filters permit the direct measurement of time-variant electromagnetic fields in a continuous frequency range whose lower bound is at $v_{ext} \approx 0$ and whose upper bound is currently at several hundred GHz to THz, depending on the type of Josephson junctions or weak links used. This entire frequency range is accessible with the aid of a single, appropriately designed superconducting quantum interference filter. In the detection of electromagnetic waves, the superconducting quantum interference filter operates simultaneously as a receiving antenna, filter and powerful amplifier. The inherent noise of suitably designed quantum interference filters can in this case be smaller by several orders of magnitude than the inherent noise of conventional SQUID magnetometers. A further advantage by comparison with conventional antennas and filters resides in this case in that, inter alia, depending on the measuring principle the frequency range is not a function of the spatial extent of the superconducting quantum interference filter. The spatial extent can influence only the sensitivity.

The production of superconducting quantum interference filters can be performed using known, cost-effective technical methods such as are applied, for example, in modern production of conventional SQUIDs. Since the spatial extent of superconducting quantum interference filters need not differ substantially from the spatial extent of conventional SQUID systems, the cryotechnologies developed for conventional SQUID systems can be taken over directly. There is no need for specific developments in the field of cryotechnology.

A2) In a system made from the cells described above, it is preferable to provide at least for one cell, favorably for the largest part of the cells, exactly two junctions per cell which are connected in a superconducting fashion and connected electrically in parallel. The effects just described can be achieved comparatively simply and effectively by exactly two junctions.

A3) However, the desired effects can also be achieved in a favorable way when more than two junctions are provided in a cell which are connected in a superconducting fashion and connected electrically in parallel, specifically in the form of a series circuit of junctions which is connected in parallel to an individual junction, or in the form of two parallel-connected series circuits of junctions.

A4) However, the effects according to the invention can also be achieved by structures of at least one cell of a network, in the case of which, in addition to a basic form of at least two junctions across which a time-variant voltage whose time average does not vanish drops, in particular in addition to a basic form of two junctions connected electrically in parallel, a further junction or a plurality of further junctions are provided, which contacts are not directly energized and therefore there is no voltage drop on average across these junctions. In this case, the connections of all the junction in the individual cells continue to be superconducting. Such embodiments can be advantageous, since the screening currents induced in the individual cells by a magnetic field can be reduced by additional junctions. The influence of self-inductances and mutual inductances can thereby be reduced.

A5) In a particularly preferred embodiment, a plurality of cells form a network or a network section, in which all junctions are connected electrically in parallel such that the junctions can be energized in the same direction. In particular, particularly high sensitivities for the measurement of a magnetic field can be achieved by means of such an arrangement when, in this connection, the cells are interconnected in a superconducting fashion.

A6) A plurality of cells or network sections can, however, also be advantageously connected electrically in series such that the junctions in the network can in turn be energized in the same direction. The magnitude of the measurement signal can be increased by this measure, since the voltages at the junctions add together in the series circuit.

A7) A particularly high sensitivity can also be achieved by the parallel connection of series arrangements of a plurality of cells or network sections. In this embodiment, the network sections or cells are preferably connected in a superconducting fashion, in particular by means of superconducting twisted-pair cables. The resolution capacity of superconducting quantum interference filters can in this case reach down to the range of aT ($10^{-18}$ tesla) and below. The calibration curve also remains unique for such measuring ranges, thus rendering possible absolute quantitative measurements of extremely small fields.

A8) The network can be used in a voltage-driven or current-driven fashion.

A9) In order to achieve Josephson effects which are as ideal as possible, it is proposed, furthermore, that the junctions are designed as point junctions.

A10) In order to increase the sensitivity of a SQIF, it is further possible for the geometry of the cell arrangement to be designed so as to reduce magnetic crosstalk from one cell to an adjacent cell on the basis of the magnetic self-field produced by a current flowing in the cells.

A11) In a further preferred refinement, the cells of the network and/or network sections are spatially aligned, in particular in two-dimensional or three-dimensional space. This measure renders it possible to determine individual magnetic field components in addition to the absolute value of the magnetic field. The direction of the magnetic field can therefore be measured in the case of a three-dimensional arrangement in space.

A12) It is further preferred if the current driving the junctions is fed in, and/or led off again through ohmic resistors which are designed, in particular, as busbar resistors. The point is that measurements have shown that the performance of the SQIF can be substantially improved by feeding the driving current through ohmic resistors.

For further refinements of the SQIFs, reference is made to FIGS. 9a to 20 and their associated parts of the description in conjunction with the description of the figures relating to FIGS. 1 to 8.

If the superconducting quantum interference filter is produced using high-temperature superconduction technology, there is no problem in using miniature coolers for permanent and reliable provision of the operating temperature. These miniature coolers typically have dimensions in the region of 10 cm and require powers of less than 20 W, and so it is possible to implement compact antenna systems that also permit the mobile use of the antenna in the most varied applications.

The antenna uses the physical phenomenon of multiple macroscopic quantum interference to enhance sensitivity. This phenomenon occurs in superconducting circuits that have a special geometry. In the case of the superconducting quantum interference filter, it is used to implement a high power, low noise broadband amplifier. In the simplest case, this amplifier is inductively coupled to a primary, passive antenna structure. Upon incidence of an electromagnetic wave, an antenna current flows in this primary antenna structure. This antenna current generates a magnetic field that permeates the superconducting quantum interference filter. If the superconducting quantum interference filter is suitably supplied with electric current and operated at a suitable operating point, a voltage that depends on the strength of the magnetic field and thus on the strength of the antenna current then drops across the superconducting quantum interference filter. Since the excitation of the superconducting quantum interference filter is caused by the quantum mechanical constraint of the so-called flux quantization, during this process no amount of energy, or only a very small one, is transferred from the primary antenna structure to the superconducting quantum interference filter. The power that is required in order to generate the voltage drop across the superconducting quantum interference filter is drawn from the current source that supplies the superconducting quantum interference filter with operating current. By contrast with conventional antennas, there is no need for energy to be drawn from the antenna, and thus from the incident wave, in order to excite the superconducting quantum interference filter. The reactive currents alone are sufficient for an excitation. The primary antenna is not subjected to loading during the transmission of the information contained in the electromagnetic wave to the superconducting quantum interference filter. Since no energy flows from the primary antenna to the superconducting quantum interference filter, there is no need for impedance matching. This renders it possible to implement extremely broadband receiving antennas of very high sensitivity when use is made of appropriate primary antenna structures.

The primary antenna structure can be composed in this case of superconducting conductor pieces or of normally conducting conductor pieces. A combination of the two is also possible. Superconducting conductor pieces have the advantage that a very high antenna current flows, but in the case of resonance the resonance is very narrowband as a rule. A lesser antenna current typically flows in normally conducting conductor pieces, but the resonances are more broadband. Consequently, a respectively optimum primary antenna structure can be designed depending on the application and required sensitivity.

In order to achieve a high sensitivity of the antenna, the primary antenna structure must be coupled with sufficient strength to the superconducting quantum interference filter. In the simplest case, this can be achieved for a single-ply layer structure by virtue of the fact that the part of the primary antenna that is to be coupled into the superconducting quantum interference filter is guided as tightly as possible past the loops of the superconducting quantum interference filter and has as small a conductor cross section as possible. The magnetic field generated by the antenna current then has a maximum value at the location of the loops. Generally speaking, the coupling is always particularly advantageous whenever the current density distribution of the primary antenna current is very great or maximum at the location of as many loops of the superconducting quantum interference filter as possible, or in their vicinity. A decoupling structure is provided in order to derive the voltage oscillation (output signal of the antenna) dropping across the superconducting quantum interference filter in the presence of a time-variant antenna current, and to pass it on to a consumer (receiver). This decoupling structure is used to convert the voltage oscillation into an electromagnetic wave that is passed on to the consumer with the aid of a suitable waveguide such that parasitic losses can be kept as small as possible.

Because of their intrinsic robustness and fault tolerance, superconducting quantum interference filters are particularly well suited as secondary antenna structures or integrated preamplifiers. They offer a range of substantial advantages by comparison with conventional superconducting magnetic field voltage transformers. In particular, superconducting quantum interference filters have a unique characteristic by contrast with conventional SQUIDs or SQUID arrays. Whereas in the case of SQUIDs or SQUID arrays it is necessary because of the periodicity of the characteristic to take particular precautions to shield parasitic magnetic fields, this is not necessary in principle with superconducting quantum interference filters. Again, the transfer factor between magnetic field and dropping voltage can basically be adapted in any required way to the amplifier task to be solved. Because of the robustness of superconducting quantum interference filters, the magnetic field coupled into the superconducting quantum interference filter by the primary antenna structures need not fulfill any condition of homogeneity. The superconducting quantum interference filter can even be excited by strongly inhomogeneous magnetic fields without power loss. In addition, because of their high intrinsic tolerance to parameter imperfections superconducting quantum interference filters are much easier to produce than are SQUID arrays, for example. The intrinsic fault tolerance also has the consequence that the most varied superconducting materials can be used.

A first important aspect of the invention relates to an antenna for electromagnetic waves composed of at least one superconducting quantum interference filter, primary antenna structures made from normally conducting and/or superconducting materials in which an antenna current is induced upon incidence of an electromagnetic wave, of means for generating an adjustable magnetic field for controlling the superconducting quantum interference filter, of means for supplying the superconducting quantum interference filter with an operating current and of means that are designed to be able to derive as electromagnetic wave a voltage oscillation dropping across the superconducting quantum interference filter, wherein the primary antenna structure is electrically connected to the superconducting quantum interference filter and/or is magnetically coupled thereto, and the superconducting quantum interference filter is supplied with an operating current in such a way and the magnetic field for controlling the superconducting quantum interference filter can be adjusted in such a way that the antenna current flowing in the antenna structure upon incidence of electromagnetic waves excites the superconducting quantum interference filter such that an electric voltage dependent on the antenna current drops across the superconducting quantum interference filter.

An advantageous refinement of the invention provides that the antenna includes additional means for driving a suitable operating point on the characteristic of the superconducting quantum interference filter (for example energizable control lines, magnetic field coils). This renders it possible to operate the superconducting quantum interference filter in a region of the characteristic in which the latter amplifies a signal optimally. In addition, it is possible to drive a region of high linearity of the characteristic in order to minimize undesired intermodulation products. The frequency of the voltage dropping across the superconducting quantum interference filter is identical to the frequency of the antenna current at such an operating point.

It is advantageous for receiving electromagnetic waves of high frequency when the output of the superconducting quantum interference filter is connected to the conventional electronics of the antenna system as directly as possible, that is to say with the smallest possible lead length. This can be achieved with the aid of low temperature transistors such as, for example, HEMT or MOSFET. These can be operated in the cold part of the antenna system, that is to say where the low temperature required for operating the superconducting quantum interference filter prevails. Such a circuit must be thermally insulated at least partially, for example by being arranged at least partially in a vacuum chamber so that it can be brought to the suitable operating temperature by active or passive cooling elements. Suitable in particular as cooling elements are both liquid gases such as, for example, liquid nitrogen or liquid helium, and active coolers such as, for example, Sterling, Joule-Thomson, or pulse tube coolers. These cooling elements can be designed with the aid of methods known from the prior art such that they can extract a sufficient quantity of heat from the thermally insulated part of the circuit and/or parts of the primary antenna structure during operation.

The nature of the thermally insulated part of the primary antenna structure at at least one location is such that it is transparent to an electromagnetic wave of the desired frequency. Depending on the frequency range in which the antenna is intended to operate, this so-called window can consist of various materials such as, for example, Teflon, silica glass, aluminum oxide, ceramic etc.

The appropriate electric supply and control lines are provided for operating the superconducting quantum interference filter and the low temperature transistor. These lines should preferably be routed in the region of the thermally insulated part of the circuit in such a way that the heat input from these lines is not too large.

In addition, means are provided for leading off the electromagnetic wave from the circuit. Typically, this is done for high frequencies initially with the aid of microstriplines and then with coaxial cables or other suitable waveguides. However, it is also possible when passing the wave through the thermal insulation to make use of contact-free transitions, for example capacitive couplers.

Superconducting high frequency lines are preferably provided for functionally connecting up primary antenna structure, superconducting quantum interference filter and low temperature transistor, since they are not, or only minimally, affected by losses. However, it can also be advantageous, for example for reasons of cost, to use normally conducting lines or hollow conductors, since these are easier to produce. Since these lines are located at least partially in the region of the thermally insulated part of the circuit and thus are at a very low temperature, even in the case of normally conducting lines there is a substantial advantage over conventional circuits with regard to dissipative losses.

Embodiments in which the lines are normally conducting and superconducting can also be advantageous. If superconducting strip lines are provided with an additional normally conducting coating, the lines can be dimensioned such that the current flows off via the normally conducting part in the case of overloading or of a short circuit, and the superconductor thereby suffers no damage.

Since antenna systems typically must have a very high level of dynamics, it can be advantageous, moreover, if superconducting quantum interference filters and low temperature transistors can be operated independently of one another in different branches of the circuit. Given the presence of large input signals for which the superconducting quantum interference filter would go into saturation, the branch thereof can be shut down and only the transistor branch can be operated. Given the presence of very small input signals, by contrast, use is made of the branch of the circuit that includes the superconducting quantum interference filter.

Thus, it is also possible to conceive an antenna system that uses only the advantages of a low temperature transistor, and therefore comprises no superconducting quantum interference filter.

Again, when it is constructed from normally conducting or from normally conducting and superconducting high frequency conductors and includes a branch composed of low temperature transistors without superconducting quantum interference filters, the antenna system can already be operated at temperatures that are higher than the transition temperature of the superconductors used. This has the advantage that less cooling power is required for relatively large input signals, and yet a higher sensitivity is achieved by comparison with transistors operated at normal temperature. Consequently, the sensitivity of the antenna system can be adjusted variably by the temperature by means of a variably adjustable extraction of heat, as is possible without any problem with active coolers, for example.

Since a substantial part of the dissipative losses are caused by power losses in the case of conventional circuits, it is additionally advantageous likewise to cool at least the high frequency lines that from the primary antenna structure to the respectively first active component, that is to say superconducting quantum interference filter or low temperature transistor.

A very effective form of thermal insulation is, for example, accommodating the circuit or parts of the circuit in an evacuatable chamber. Such chambers can be designed such that they maintain the vacuum and thus the thermal insulation over a number of years. Particularly when active coolers are used, a cooling finger can be mounted in a vacuum chamber cost effectively and in a space saving fashion.

The thermal insulation of the circuit or parts of the circuit is advantageously itself already designed as part of the primary antenna structure. This can be performed, for example, by using dielectric material (for example Teflon foam) for the thermal insulation and fashioning the latter geometrically such that the incident electromagnetic wave can be focused onto the superconducting quantum interference filter or another coupling structure. Again, the thermal insulation can be performed by means of a metallic vacuum chamber. The metallic vacuum chamber itself can then, in turn, be designed as part of the primary antenna structure. For example, the metallic vacuum chamber can be designed as a waveguide or waveguide termination supplied from a primary aperture. Again, the vacuum chamber can advantageously be provided with high frequency windows that act as primary aperture antennas.

In a preferred embodiment, the entire dissipative losses and thus the inherent noise of the system can be minimized by thermal insulation and cooling of the entire circuit composed of superconducting quantum interference filter, low temperature transistor and primary antenna structure. This produces an apparatus with maximum performance.

In a particularly advantageous embodiment, especially for the GHz frequency range, the decoupling part of the primary antenna structure is designed as a hollow conductor termination into which an elongated antenna element, for example an antenna pin projects. With the aid of this antenna pin electrically insulated from the hollow conductor, the electromagnetic wave is decoupled directly with low loss, particularly when the hollow conductor termination is at a low temperature, or is transported to the input of an active component with the aid of a suitable line. By connecting a plurality of active components in series, it is already possible to achieve in the cold part of the circuit an amplification of the antenna signal that is of very low noise. The thermal insulation of the circuit and of the hollow conductor termination is advantageously performed by means of an evacuatable chamber.

In a development of the embodiment described in the last paragraph, the hollow conductor termination is provided with two, in particular pin-shaped, antenna elements that are fitted offset from one another. This has the advantage that two independent polarizations can be decoupled from the hollow conductor separately from one another. The separate coupling to in each case one active component permits the separate processing of the two polarizations.

For applications in which the overall space of the antenna system is to be as small as possible, it is advantageous to use arrays of aperture or slot antennas as primary antenna structure, particularly in the range of GHz frequencies.

Because of the high sensitivity of superconducting quantum interference filters, the size of the overall aperture is generally given in the case of antenna arrays only by the desired directional characteristic of the antenna system. The physical aperture can therefore be composed both of one-dimensional, two-dimensional and of three-dimensional arrays of primary antennas. The assembly of the output signals of the individual antennas of the antenna array can be performed by means of a structure of hollow conductors or microstriplines. Particularly powerful antenna systems also result when the primary antenna structure is composed of superconductors, particularly when the output signals of the individual antennas of the array are assembled with the aid of superconducting high frequency lines. If use is made in such arrays of additional active components such as, for example, phase shifters to control the directional characteristic, a further advantage arises since these components also produce very much less noise at low temperatures, and operate more efficiently.

The directional characteristic of the antenna system can also be modeled very effectively with the aid of primary antenna structures that are designed as arrays of patch antennas. In particular, a separation of polarization can already be performed on the plane of the individual antennas given appropriate design of the individual antennas of the antenna array.

The use of electromagnetic lenses as primary antenna structure is advantageous when signals of different polarization or signals with temporally variant polarization are to be received simultaneously by the antenna system. Since electromagnetic lenses retain the polarization of the incident wave, tracking on the plane of the primary antenna structure is eliminated in the event of temporal changes in the polarization of the incident wave.

For applications in which very large instantaneous bandwidths are required, it is advantageous to use horn antennas as primary antenna structure. By means of appropriately dimensioned hollow conductor structures, the output signal of the horn antennas can be coupled very efficiently to a superconducting quantum interference filter.

Very large instantaneous bandwidths can also be achieved by using parabolic antennas. Given the same effective aperture, a quantum antenna thus designed is more powerful by a multiple than a conventional parabolic antenna of the same size, particularly in the GHz frequency range. In addition, a very high directional effect of the antenna system can be achieved with the aid of arrays of parabolic antennas.

In a further advantageous refinement of the invention, the electrodes of the superconducting quantum interference filter themselves are designed as the primary antenna structures. This refinement has the advantage that the magnetic field of the antenna current flowing in these structures is coupled directly into the loops of the superconducting quantum interference filter. The extent of the antenna can thereby be further reduced.

Since the superconducting quantum interference filter can have different impedances depending on the type of Josephson junctions used, it is advantageous, furthermore, to equip the antenna circuit with an impedance transformer which transforms the impedance of the superconducting quantum interference filter to the impedance of a waveguide that leads off the signal.

It is known that the Josephson junctions that the superconducting quantum interference filter includes are nonlinear oscillators in which a high frequency oscillating current flows. It is likewise known that such Josephson oscillators can also be synchronized (lock) onto the frequency of an externally irradiated wave. Because of the Josephson relation, the DC voltage dropping across the junctions is then rigorously proportional to the frequency of the irradiated wave. If the information to be received in the incident wave is coded via the frequency (frequency modulation), the time characteristic of the DC voltage dropping across the junctions and thus of the DC voltage dropping across the superconducting quantum interference filter then corresponds to the information content of the incident wave. Because of the uniqueness of the characteristic of the superconducting quantum interference filter, the frequency of the Josephson oscillation in the superconducting quantum interference filter can be adjusted very exactly by appropriate selection of the operating current supplying the superconducting quantum interference filter, and of a magnetic control field. On the one hand, it is thereby ensured that the superconducting quantum interference filter locks onto the carrier frequency of the incident wave, while on the other hand this frequency can be changed very easily.

In all cases where the carrier frequency oscillates quickly by comparison with the modulation frequency, the received signal is automatically demodulated in this operating mode of the antenna, and can be processed further directly. Another embodiment of the invention is therefore suitable in particular for the frequency range between 1 GHz and 100 GHz and is very advantageous because the conventionally required downmixing of the signal with the aid of local oscillators is eliminated.

Moreover, because of the simpler method of production, it is advantageous when the primary antenna structure and the superconducting quantum interference filter are located on a common carrier (chip). This permits the fabrication of integrated antenna chips with the aid of known methods of thin film technology.

In specific wavelength regions and given the use of materials that do not permit multilayer technology, it can, however, also be advantageous to apply the two functional elements of the antenna to different carriers. These carriers can then be coupled with the aid of electric wires. This arrangement is also advantageous when the primary antenna structure is to be aligned spatially in a fashion other than the superconducting quantum interference filter because of the overall space, because of the reduction of external interference or because of other reasons. A further advantage consists in that different materials can be used for the different carriers.

When the antenna must have a very high sensitivity and no multilayer technology is available, it is also possible to achieve efficient coupling between primary antenna structure and superconducting quantum interference filter by virtue of the fact that the carriers of the two functional elements are fitted directly one above another and, for example, bonded to one another.

Superconducting electronic components require very low operating temperatures. The outlay required for producing and maintaining these temperatures rises very sharply the lower the operating temperature of the superconductors used. In principle, all known superconductors from which it is possible to produce Josephson junctions can be used for the antennas. However, it is advantageous to use materials in the case of which the operating temperature is as high as possible. These known materials are so-called high temperature superconductors whose operating temperatures reach over approximately −200° C. and that can be cooled cost effectively with the aid of liquid nitrogen. The known simplest and most cost effective method of producing Josephson junctions from such materials is the method of grain boundary junctions. Although these junctions have very inhomogeneous parameters and are therefore otherwise very little suited to quantum electronic circuits, because of the design-induced very high fault tolerance of superconducting quantum interference filters they can, however, be used without any problem in the case of the antenna.

Moreover, it is advantageous when the primary antenna structures also consist of high temperature superconductors. Since a super conductor has the property that electric fields vanish completely in its interior, higher antenna currents flow as a rule in such structures than in normally conducting structures. This increases the sensitivity of the antenna.

If the antenna consists of superconductors or of superconductors and normal conductors, it can also be operated actively, that is to say with the aid of a cooler, without the use of liquid coolants. Whereas liquid coolants must be replaced regularly and the operating times are thereby very restricted, coolers can make the required operating temperatures available permanently and reliably. Because of the use of superconducting quantum interference filters that have a very high level of dynamics, the electromagnetic interference caused by the coolers does not lead to a loss in performance of the antenna. Given the use of high temperature superconductors, the typical powers that are required to operate a cooler are very low and are in the range of 20 W-40 W. Such powers can also be made available in mobile use, mostly without any problems.

During operation of the antenna in a cooler, it is favorable when the antenna is located on a chip that is fitted directly on the cooling finger of the cooler. The required cooling power is substantially reduced thereby, and it is possible to use very small coolers. The required cooling power is further reduced when the output signal of the antenna is led off the antenna chip with the aid of a waveguide that conducts heat poorly.

Moreover, it is advantageous when the waveguide is used simultaneously for supplying the antenna with electric energy. This saves additional cables that would increase the thermal loading and thus the required cooling power.

Particularly in the case of receive frequencies in the GHz range, it is advantageous for the primary antenna structure to be of resonant design. This is done in the simplest way by using antenna rods or arrays whose length is in the region of half the wavelength of the incident wave. In this case, large reactive currents flow in the antenna structures, something which sharply increases the sensitivity of the antenna. It is also possible in this case to use patch or patch-like antennas whose dimensions are in the region of half the wavelength of the incident wave.

Since no impedance matching of the primary antenna structure is required, it is also possible to use magnetic loop antennas as primary antenna structures. Since the superconducting quantum interference filter is extremely low in noise, such loop antennas can also be used up to very high frequencies. The advantage of loop antennas resides here in that their dimensions can be very much smaller than the wavelength of the incident wave. Since it is only the antenna currents that are important, both open and closed loop antennas can be used.

Because of the very high sensitivity of superconducting quantum interference filters, it is also possible to use individual or arrays of electrically small antennas. The dimensions of such primary antennas are certainly smaller than the wavelength of the incident wave, but even without a matching network the antenna currents induced in them generally suffice to excite the superconducting quantum interference filter sufficiently.

For specific applications, in particular in the case of very high frequencies, it can also be advantageous to use a dielectric layer as primary antenna structure. Instances of resonance likewise occur in such layers, and surface currents flow that can be coupled into the superconducting quantum interference filter. Combinations of dielectric layers with conducting structures are also possible.

The primary antenna structure can also be composed of a resonant cavity inside which the superconducting quantum interference filter is fitted at a suitable location on maximum magnetic field strength. Specific modes can then be selected depending on the position of the superconducting quantum interference filter inside the cavity. This can be advantageous, in particular, for polarization separation and for further enhancement of the sensitivity.

If frequency filter elements are additionally fitted in the primary antenna structure or between primary antenna structure and superconducting quantum interference filter, appropriate frequency bands can then be selected in a targeted fashion. It is thereby possible to implement a multiband antenna. This can be of great advantage whenever very large differences prevail in the signal strengths of the incident waves simultaneously in different frequency bands. Excessively strong signals in specific bands that would mask the weak signals to be received can thereby be eliminated.

The performance of the antenna can be enhanced by installing additional active and/or passive electronic components. This is the case, in particular, when the transfer of the output signal of the antenna to the conventional receiving electronics is to be performed directly at the output of the superconducting quantum interference filter in order to avoid parasitic losses. Propagation time losses can be minimized thereby, in particular in the case of very high frequencies. Since the antenna itself takes up only very little overall space, the additional electronic components can be accommodated in the cold part of the circuit. Given appropriate selection of the components, there is thus a substantial reduction in the thermal noise, and the sensitivity of the overall system of antenna and receiver rises.

The sensitivity can also be increased by the use of two or more inventive antennas in an antenna array. Such antenna arrays can be cooled jointly by a cooler, or each antenna has its own cooler. Antenna arrays have the advantage that the sensitivity of the overall system rises sharply with the number of antennas used (supergain). In addition, strongly pronounced directional characteristics can, moreover, be produced by an appropriate arrangement of the individual antennas in the array (superdirectivity).

If inventive antennas are arranged in an antenna array, and the output signals of the individual antennas are superposed in a phase-sensitive fashion with the aid of suitable means such as, for example, electronically controllable phase shifters or delay lines, to form an aggregate signal, this has the advantage, furthermore, that the spatial position of the transmitter of the received electromagnetic wave can be determined very exactly. If the location of the transmitter is known, this method can be used, on the other hand, to discriminate between different transmitters. Since inventive antennas draw no energy, or only a very slight amount, from the electromagnetic field, the determination of the position of inventive antennas is, by contrast, exceptionally difficult.

A particularly cost effective and efficacious production method for the antenna can be used whenever the circuit is designed using the known microstripline technology. In this technology, electrode and counter-electrode of the circuit are not both fitted on the surface of a carrier (chip), but the carrier is provided with a base plate that forms the counter-electrode. It is then only the conductor tracks of the electrode that are situated on the surface of the carrier. This method permits a very high integration density on the carrier and minimizes the losses because the electric fields are substantially concentrated in the substrate of the carrier. If the antenna chip is operated on the cooling finger of an active cooler, it is also possible for this cooling finger itself to be used as base plate (counter-electrode).

Particularly at frequencies of less than 1 GHz, it is advantageous to equip the superconducting quantum interference filter with a feedback loop. In this case, the output signal of the superconducting quantum interference filter is fed back to the superconducting quantum interference filter either positively—to increase the sensitivity—or negatively—to stabilize the operating point. In the case of negative feedback, the circuit can be operated in this case such that the operating point on the characteristic of the superconducting quantum interference filter remains constant. In this case, the feedback current or the feedback voltage includes the information of the incident wave.

Because of the reciprocity of reception and transmission of electromagnetic waves, the antenna can also be designed in such a way that it emits an electromagnetic wave. If the impedance of the superconducting quantum interference filter is tuned to the radiation impedance of the primary antenna field, the superconducting quantum interference filter then impresses on the primary antenna array a voltage oscillation fed into it. The primary antenna array then emits an electromagnetic wave. It is true that the emitted power is low in general because of the functional principle of the antenna, but this embodiment can be advantageous when, in addition to reception, the aim is to fulfill still further tasks, for example the synchronization of antennas operating spatially separately from one another.

The following citations may be specified in relation to the prior art:

J. D. Kraus, Antennas, 2nd Edition, McGraw-Hill, 1988.

S. Ramo, J. R. Whinnery, T. VanDuzer, Fields and waves in communication electronics, 3rd edition, John Wiley, 1994.

A. Barone and G. Paterno, Physics and Applications of the Josephson Effect, John Wiley, 1982.

J. Hinken, Superconducting Electronics, Springer, 1988.

K. K. Likharev, Dynamics of Josephson junctions and circuits, Gordon and Breach, 1991.

R. D. Parmentier and N. F. Pedersen, Nonlinear superconducting devices and High-Tc materials, World Scientific, 1995.

J. C. Gallop et al., SQUIDS, the Josephson Effect and superconducting electronics, Hilger, 1991.

H. Weinstock (editor), SQUID Sensors: Fundamentals, Fabrication and Applications, Kluwer Academic Publishers, 1996.

J. Oppenländer, Ch. Häußler and N. Schopohl, Phys. Rev. B63, 024511 (2001).

Ch. Häußler, J. Oppenländer and N. Schopohl, J. Appl. Phys. 89, 1875 (2001).

J. Oppenländer, T. Träuble, Ch. Häußler and N. Schopohl, IEEE Trans. Appl. Supercond. 11, 1271 (2001).

J. Oppenländer, Ch. Häußler, T. Träuble and N. Schopohl, Physica C 368, 119 (2002).

V. Schultze, R. Ijsselsteijn, H.-G. Meyer, J. Oppenländer, Ch. Häußler and N. Schopohl, IEEE Trans. Appl. Supercond. 13, (to appear June 2003).

BRIEF DESCRIPTION OF THE DRAWINGS

A plurality of exemplary embodiments are illustrated in the drawings and explained in more detail with a specification of further advantages and details.

FIG. 1 shows the typical magnetic field voltage characteristic of a superconducting quantum interference filter, and the definition of a suitable operating point, FIG. 2c shows an antenna circuit in the case of which the output signal of the antenna is decoupled via a coplanar impedance transformer, FIGS. 10a to f show circuit diagrams of further superconducting circuits.

DETAILED DESCRIPTION OF THE INVENTION

A typical characteristic of a superconducting quantum interference filter (SQIF) is illustrated in FIG. 1. If the SQIF is supplied with an electric current of suitable strength, a voltage dependent on the magnetic field that permeates the SQIF drops across the SQIF. By contrast with the known, conventional SQUIDs, the characteristic is not periodic, but has an unambiguous minimum in the vanishing magnetic field B=0. Since the characteristic is not sinusoidal, as with the conventional SQUIDs or SQUID arrays, the linearity of its edge 1 or 1* is very high. By setting a suitable operating point 2, something which can be performed, for example, by applying a constant magnetic field (control field), the SQIF can be operated with high linearity as an amplifier or as a current-to-voltage converter.

Figure 2A:
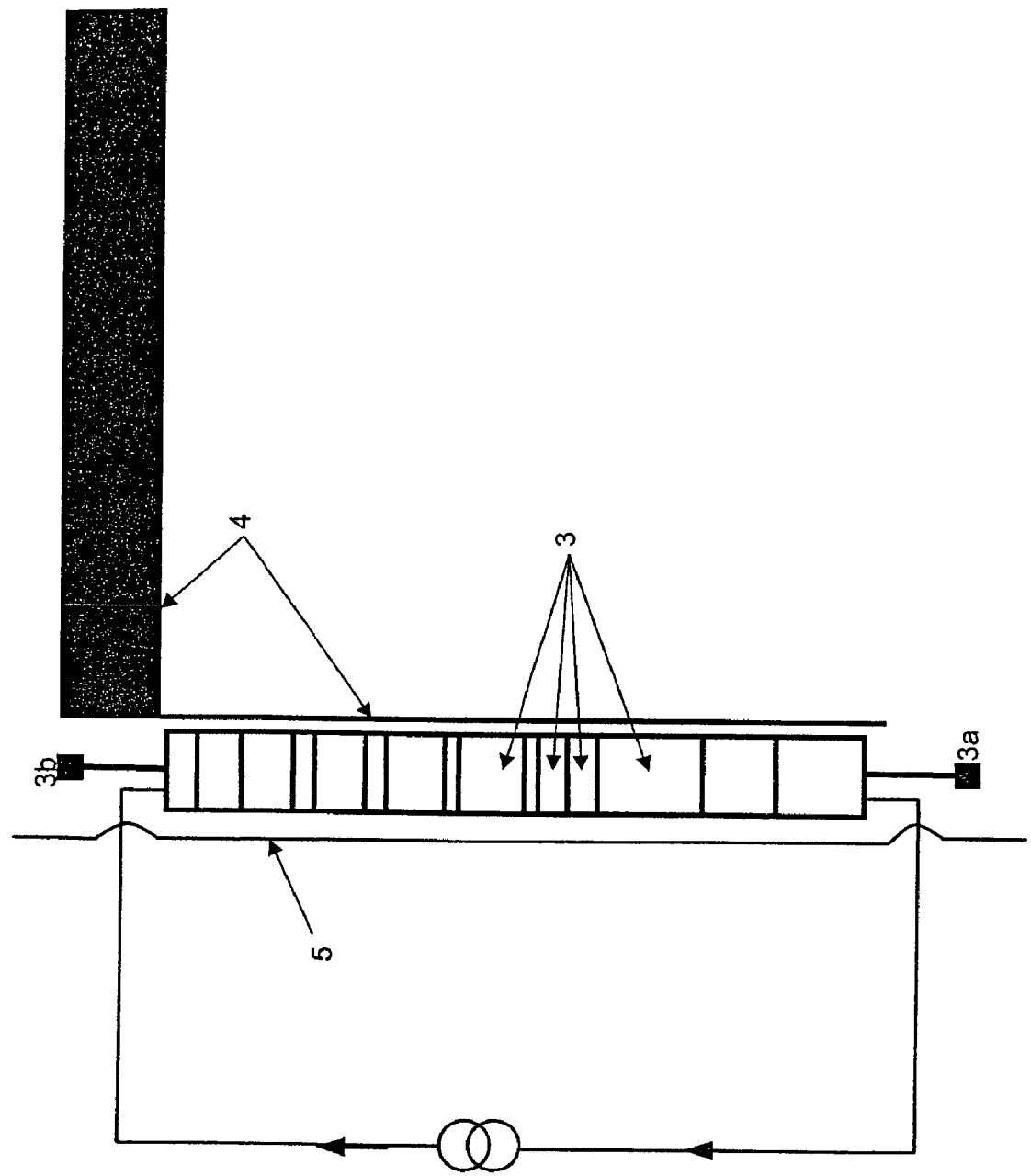
FIG. 2a shows a typical circuit design of an inventive antenna with superconducting quantum interference filter and coupled primary antenna structure.

A typical antenna circuit is illustrated in FIG. 2a. The SQIF 3 is coupled inductively to a primary antenna 4. Upon incidence of an electromagnetic wave, an antenna current flows through the primary antenna 4. Since the antenna is guided spatially in a specific region tightly along the SQIF, this antenna current generates a magnetic field at the location of the SQIF loops. If the SQIF is operated at a suitable operating point 2, a voltage whose direction depends on the direction of the antenna current drops across the SQIF. In this way, the SQIF generates a voltage oscillation that corresponds to the oscillation of the antenna current. By suitable selection of the number of the SQIF loops 3, it is possible in principle to adjust the range of the voltage dropping across the SQIF as desired, and thus to select any desired dynamic range of the current-to-voltage converter. The magnetic field required for controlling the SQIF can result from a field coil or from a control line 5 loaded with a suitable current. This line can also be used to stabilize the operating point or to feed back into the SQIF the voltage signal generated by the SQIF, for example, with the aid of an electric resistor. The electrodes 3a and 3b are fitted on the SQIF so that the voltage oscillation dropping across the SQIF can be passed on to a receiver. These electrodes are connected to a waveguide suitable for the respective frequency range and which passes on the output signal of the SQIF to the receiver in a fashion as free from loss as possible.

In the simplest case, the SQIF is operated without controlling the operating point at the minimum of the characteristic. The voltage signal generated by the SQIF then has double the frequency of the oscillation of the antenna current. It is possible, in particular, in this operating mode of the antenna to receive binary phase-coded signals very easily and reliably.

Figure 2B:
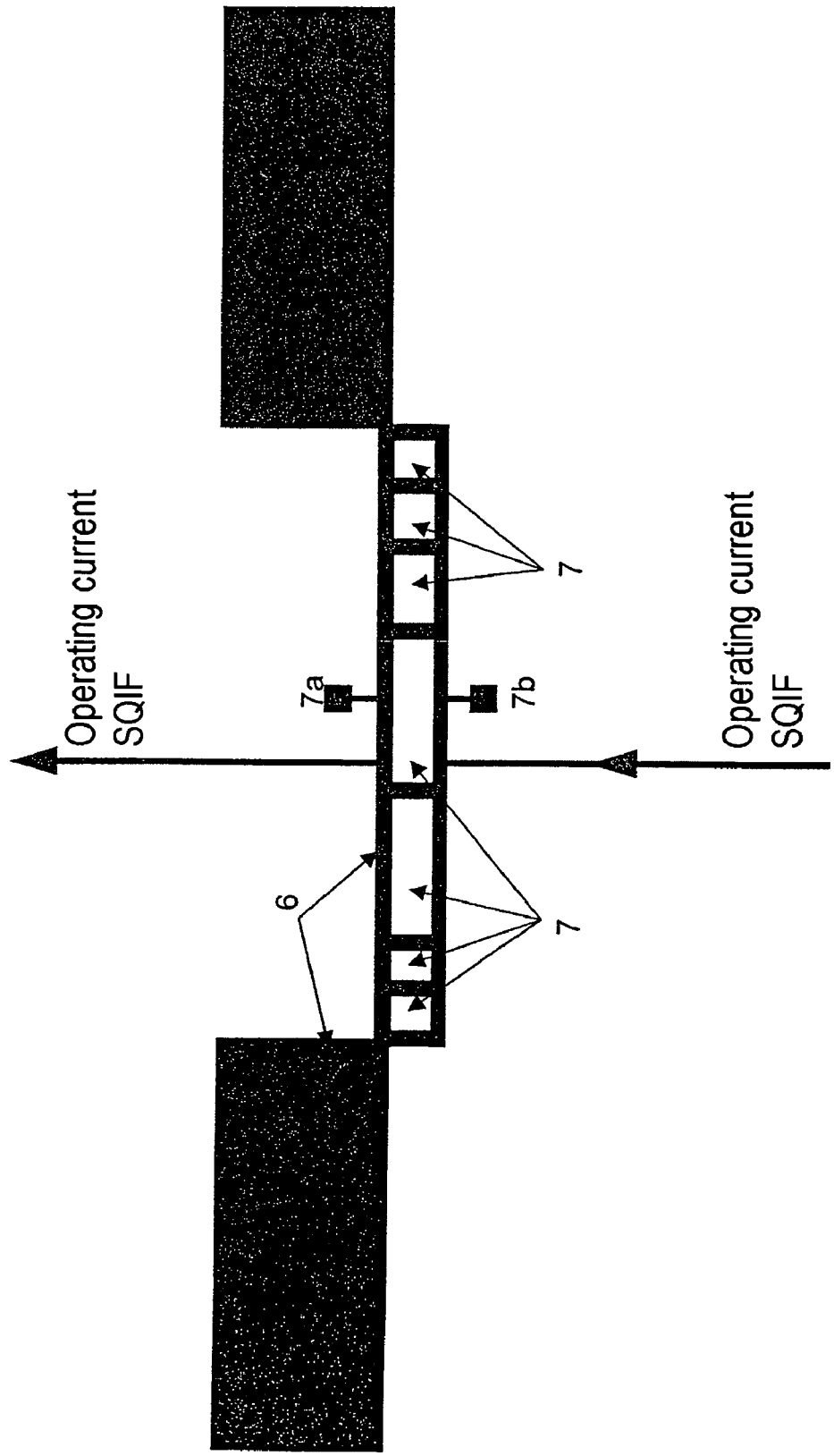
FIG. 2b shows an inventive antenna in the case of which the electrodes of the superconducting quantum interference filter are themselves designed as primary antenna structures.

A parallel SQIF is designed in FIG. 2b in such a way that the electrodes of the SQIF themselves constitute the primary antenna structure. Upon incidence of an electromagnetic wave of appropriate polarization, an antenna current is induced in the electrode 6. This antenna current couples a magnetic field directly into the loops 7 of the SQIF. The output signal on the SQIF is led off with the aid of the electrodes 7a and 7b. The electrodes 6 can also be designed in this case as a closed loop (an embodiment not illustrated). In an embodiment that is likewise not illustrated, the electrodes of the individual SQIF loops or of groups of loops are constructed as respective individual antenna rods or antenna structures. This embodiment has the advantage that the individual antenna structures can be of different design, and thus permit the bandwidth of the antenna to be adjusted.

FIG. 2c illustrates an antenna circuit in the case of which the output signal of the SQIF 8 is decoupled via a coplanar stripline 9. Located at the end of the coplanar stripline 9 is a coplanar impedance transformer structure 10 that transforms the impedance of the SQIF to the impedance of the directed waveguide 11. Losses owing to impedance matching of the SQIF and waveguide or consumer (receiver circuit) can thereby be avoided.

The primary antenna structure is composed in FIG. 2c of antenna rods 12 at whose end a spiral winding 13 is fitted. The spiral windings 13 are fitted directly above the loops of the SQIF 14, something which is possible, for example, without any problem in multilayer thin film technology. The magnetic field generated by the antenna currents is coupled very effectively into the SQIF in such arrangements.

Figure 2D:
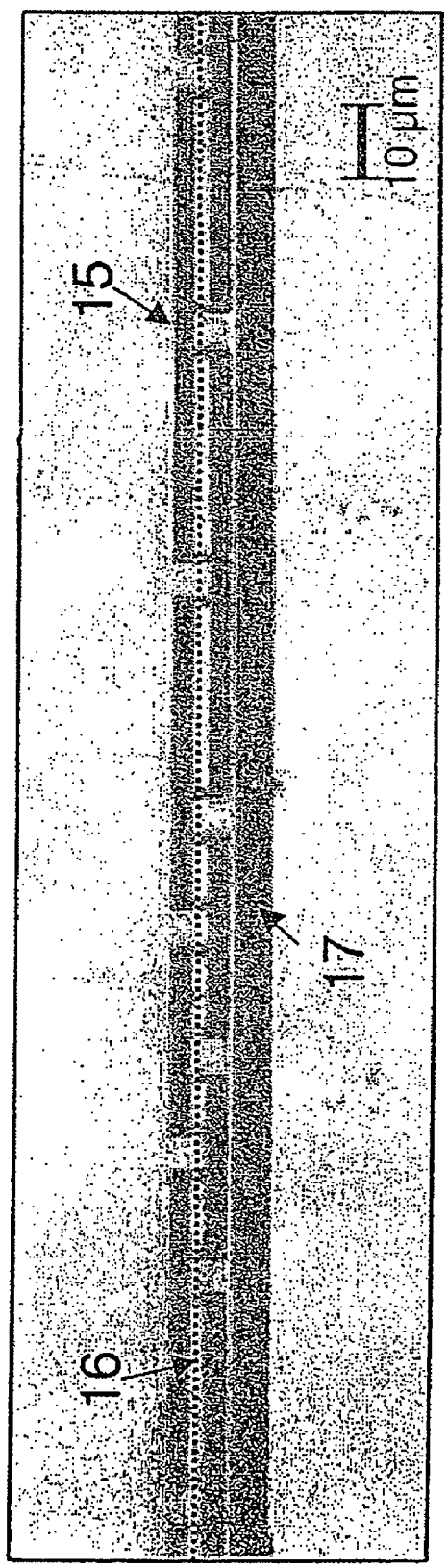
FIG. 2d shows an antenna with grain boundary Josephson junctions, designed using high temperature superconductor technology.

Illustrated in FIG. 2d is an antenna circuit in the case of which the SQIF and primary antenna structure have been produced from high temperature superconductors (here YBCO). The Josephson junctions are grain boundary junctions here. These grain boundary junctions arise when a conductor track 15 crosses the grain boundary 16. Because of the simple design of the junctions, the scatters of the junction parameters are very high. By contrast with conventional quantum electronic circuits, this does not, however, influence the performance of the SQIF. The line 17 is part of the primary antenna structure and coupled to the SQIF inductively.

Figure 3:
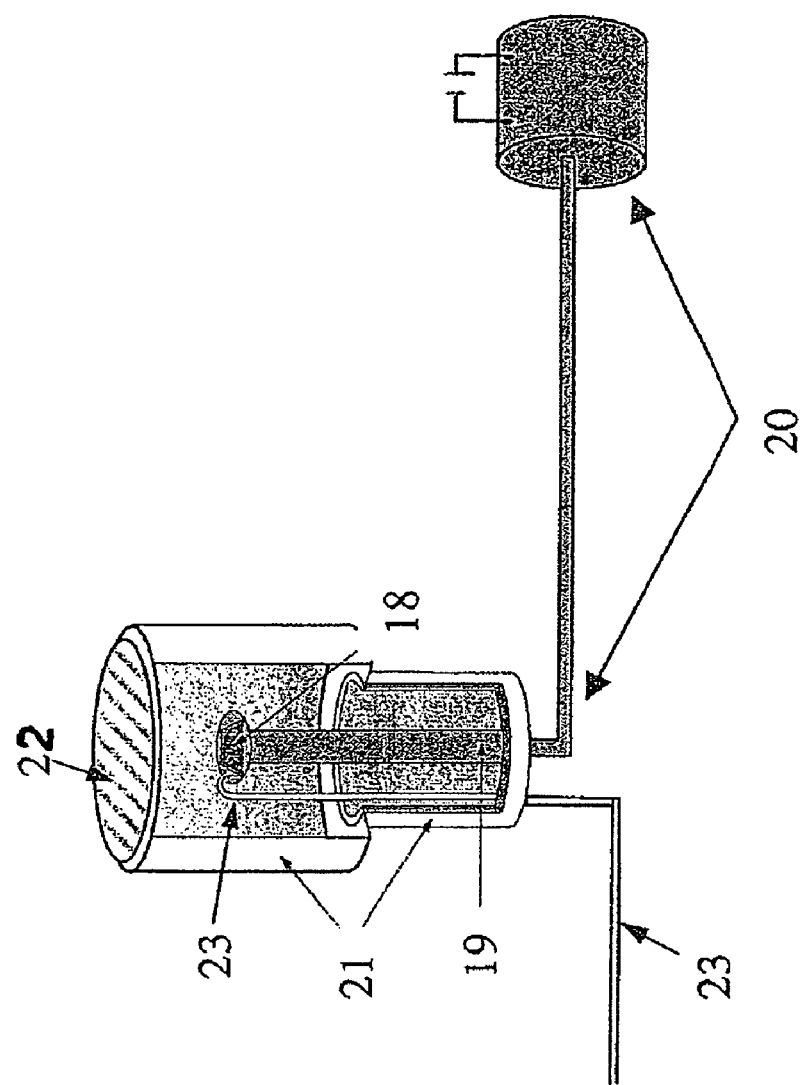
FIG. 3 shows the diagrammatic illustration of the operation of an inventive antenna in an active cooling system.

FIG. 3 shows an exemplary embodiment in which an antenna chip is operated in a small cooler. The antenna circuit 18 is located on chip. The chip itself is thermally coupled to the cooling finger 19 of the small cooler 20. The antenna chip and small cooler are located in a vacuum flask 21 for the purpose of thermal insulation. The vacuum flask 21 has a window 22 transparent to electromagnetic waves. The output signal of the antenna is led off from the antenna chip via a vacuum-tight waveguide 23 that is a poor conductor of heat. Because of the large dynamic range of SQIFs, it is possible to use coolers of the most varied design.

In an embodiment that is not illustrated, the cooling finger on which the antenna chip is located is itself designed as primary antenna structure. Since the carrier (substrate) couples the cooling finger magnetically and electrically to the SQIF in any case, this embodiment has the advantage that it is not mandatory for a primary antenna structure to be located on the chip.

Figure 4A:
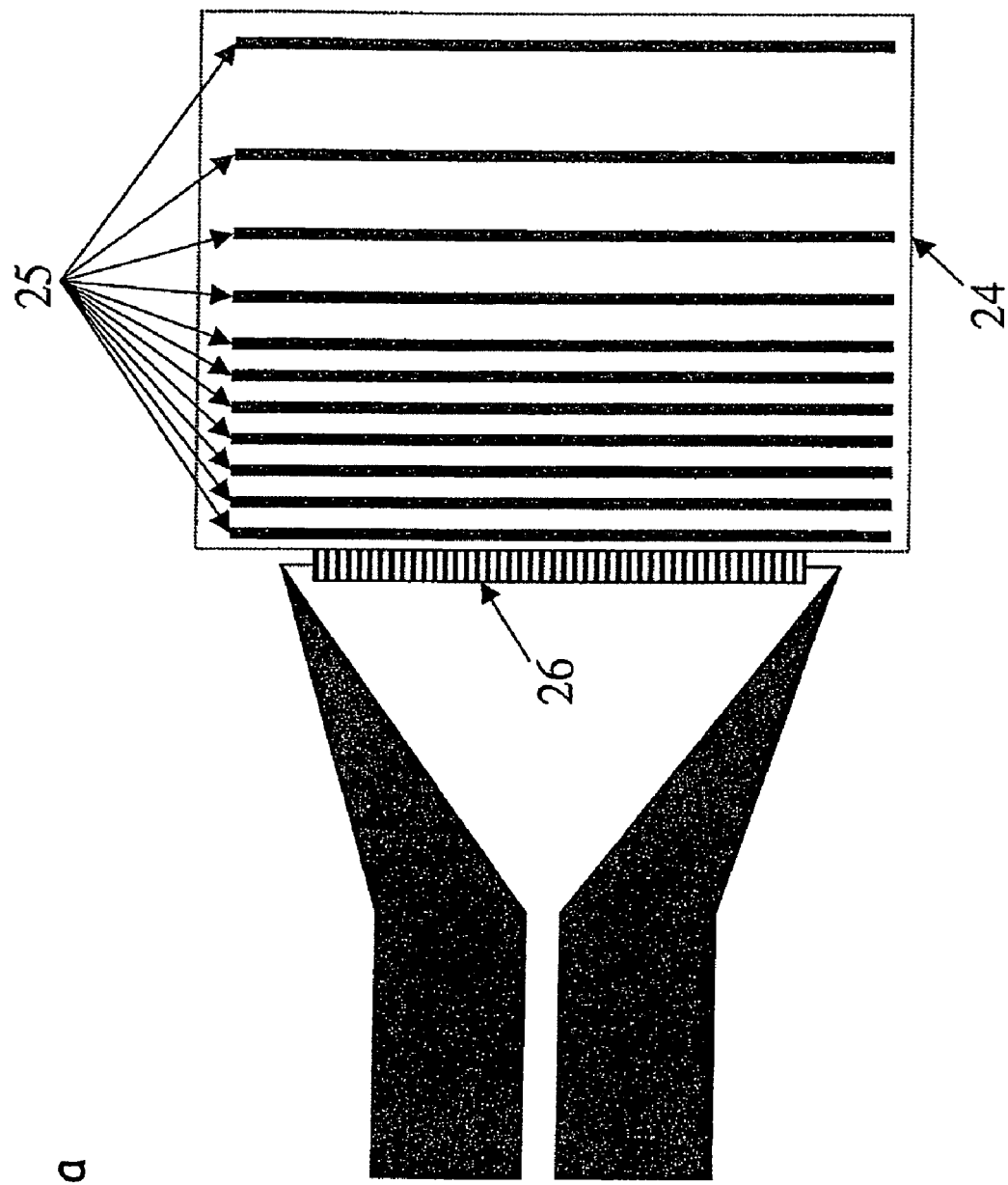
FIG. 4a shows a primary antenna array with geometrical resonance.

In FIG. 4a, the primary antenna array 24 is composed of line pieces 25 whose length has been selected as half the wavelength of the electromagnetic wave to be received. This embodiment has the advantage that in the case of resonance high reactive currents flow in the antenna structure and thereby excite the SQIF 26 optimally. By appropriate design of the antenna array with antenna pieces of easily distinguishable length or easily distinguishable spacing from one another, it is possible to model a frequency band within which the antenna is particularly sensitive.

Figure 4B:
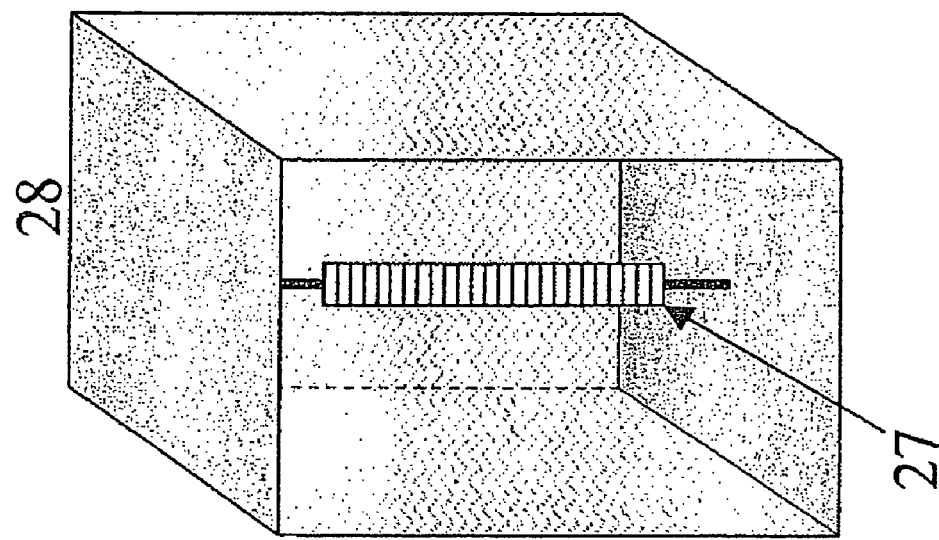
FIG. 4b shows an inventive antenna in the case of which the primary antenna structure is designed as resonant cavity.

FIG. 4b illustrates an embodiment in the case of which the SQIF 27 is located in a resonant cavity 28 (waveguide open at one end). In addition to the enhancement of the sensitivity, this has the advantage that specific electromagnetic modes, for example for the purpose of polarization separation, can be selected using the position of the SQIF relative to the cavity.

In an embodiment that is not illustrated, several or many antennas are arranged in antenna arrays. This has the advantage that the sensitivity grows with the number of the antennas, supergain effects can be used, and a specific directional characteristic can be modeled.

In an embodiment that is likewise not illustrated, the elements of such an antenna array are operated in a phase-controlled fashion (phased array antenna). For this purpose, suitable phase shifters are used to superpose the output signals of the various antennas having different phase angles. This has the advantage that it is thereby possible to select the spatial position of the transmitter of the received electromagnetic wave. In particular, when the spacings between the antennas in the antenna array are selected incommensurably, it is possible to use a phase-sensitive superposition of the output signals of the various antennas of the antenna array to determine the spatial position of the transmitter of the electromagnetic wave. Because of the functional principle based on a quantum mechanical effect, the very high linearity of the active antenna and the low operating temperature, the phase noise of antennas according to the invention is very low. In addition to the very high sensitive by comparison with conventional antennas, this low phase noise is a further great advantage of antennas according to the invention.

Figure 4C:
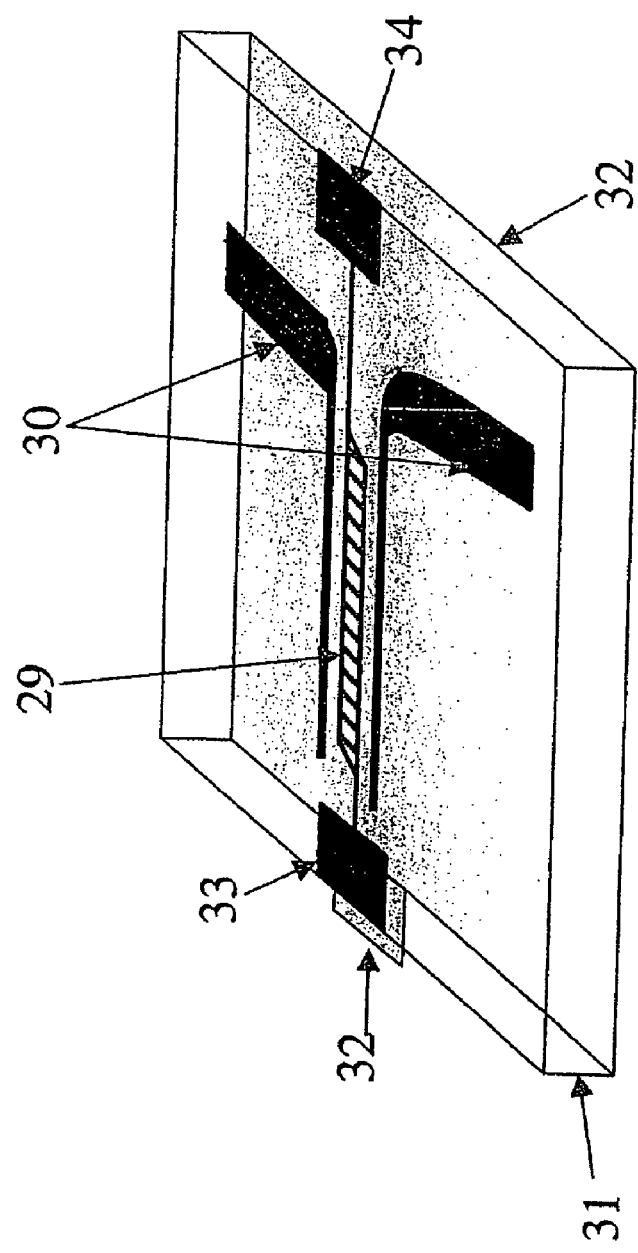
FIG. 4c shows an antenna circuit designed using microstrip technology.

FIG. 4c illustrates an exemplary embodiment of the antenna in microstripline technology. The SQIF 29 and the primary antenna structure 30 are located on the top side of a substrate 31. The electrically conducting base plate 32 forms the counter-electrode. The voltage dropping across the SQIF 29 on excitation is capped between the electrode 33 and the base plate 32. The electrode 34 serves the purpose of supplying power to the SQIF and/or of connection to the base plate. In the case of substrates that permit this, it is also possible to make use for this purpose of plated-through holes (vias) to the base plate. When use is made of multi-layer technologies, the base plate (counter-electrode) can also be formed by conducting layer structures on the surface of the substrate.

If the active antenna or the antenna chip is operated in an active cooling system, the cooling finger itself, on which the active antenna is fitted, can also be used as counter-electrode (base plate). Since the cooling finger typically consists of metals that conduct heat very well, and therefore generally of materials that are also very good electric conductors, such a design has great advantages in terms of production engineering.

Figure 5:
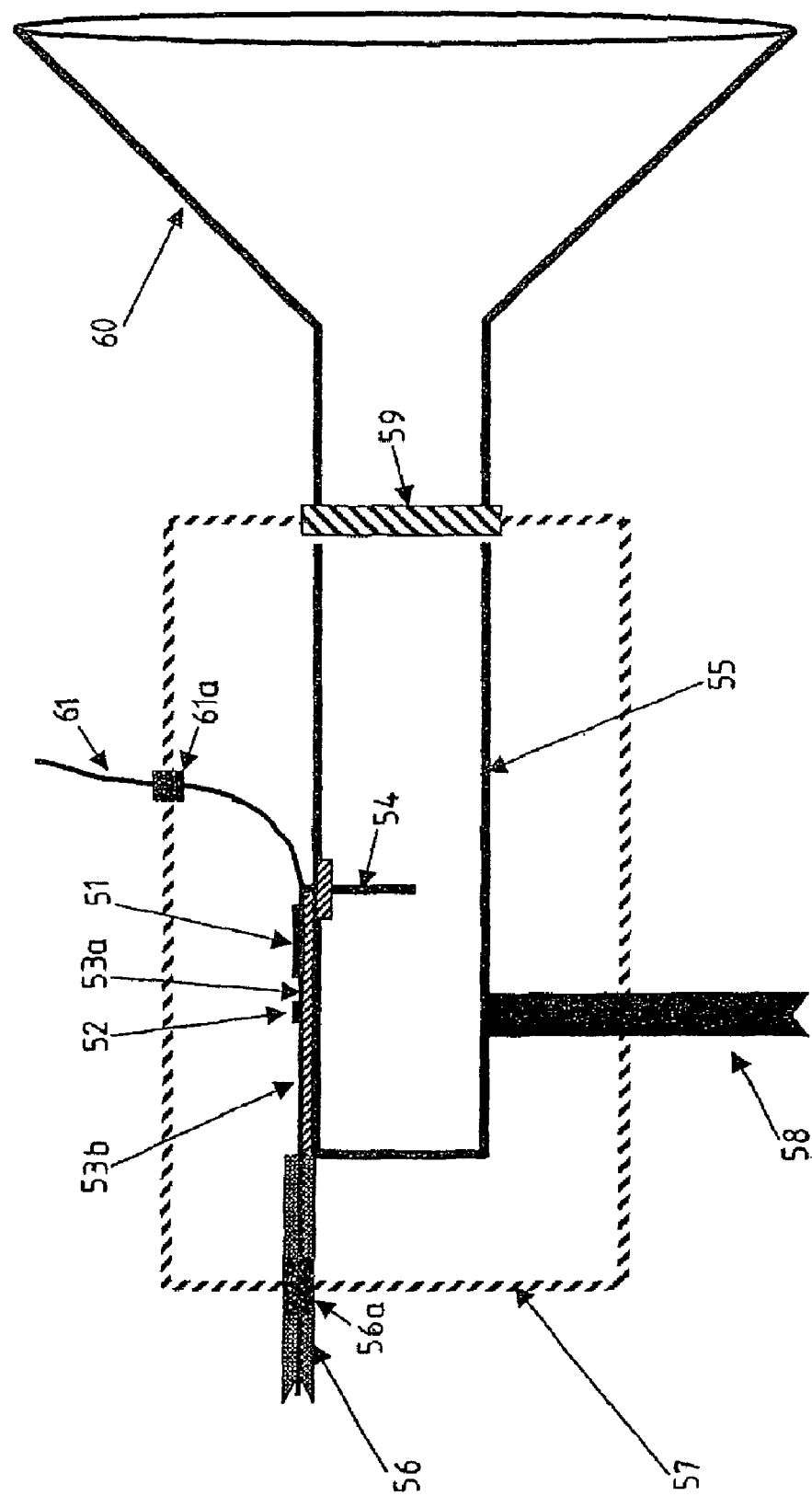
FIG. 5 shows the highly diagrammatic illustration of an antenna structure for electromagnetic waves of high frequency.

FIG. 5 illustrates an exemplary embodiment for electromagnetic waves of high frequency. The primary antenna structure is composed of a horn antenna 60 and a hollow conductor termination 55 with antenna pin 54. The antenna pin 54 decouples the incident wave from the hollow conductor termination. The antenna pin 54 is connected directly to the input of a superconducting quantum interference filter 51. A further amplification of the signal is achieved by a low temperature transistor 52 that is connected as amplifier. The superconducting quantum interference filter 51 and the transistor 52 are interconnected via a microstripline 53a. The amplified signal is fed into a waveguide 56 via a further microstripline 53b. The hollow conductor terminal 55 and the circuit composed of antenna pin, superconducting quantum interference filter and low temperature transistor are located inside a thermal insulation 57 that has a high frequency window 59. The waveguide 56 leaves the thermal insulation 57 via a feed through 56a. The control and supply lines 61 of the circuit are guided through the feed through 61a. The circuit 51, 52, 53a, 53b is coupled via the hollow conductor termination 55 and a thermal conductor 58 to a cold reservoir (not illustrated) (passive cooling, for example by means of liquid gas), or to an active cooler (active cooling, for example Sterling or pulse tube cooler).

The antenna pin 54 and the microstriplines 53 can be of normally conducting and/or superconducting design. The hollow conductor termination 55 can also be constructed from superconducting materials for the purpose of further depressing the inherent noise. The active or passive cooling elements should preferably be designed with reference to their cooling power such that the superconducting transition temperature can be achieved at least at the location of the components constructed from superconductors.

The thermal insulation 57 can be designed as a vacuum chamber. The high frequency window 59 then acts simultaneously as vacuum window, and the feed throughs 56a and 61a are designed as vacuum-tight feed throughs. Vacuum chambers have the advantage of very good thermal insulation, and permit the antenna to be operated at very low temperatures.

Figure 6:
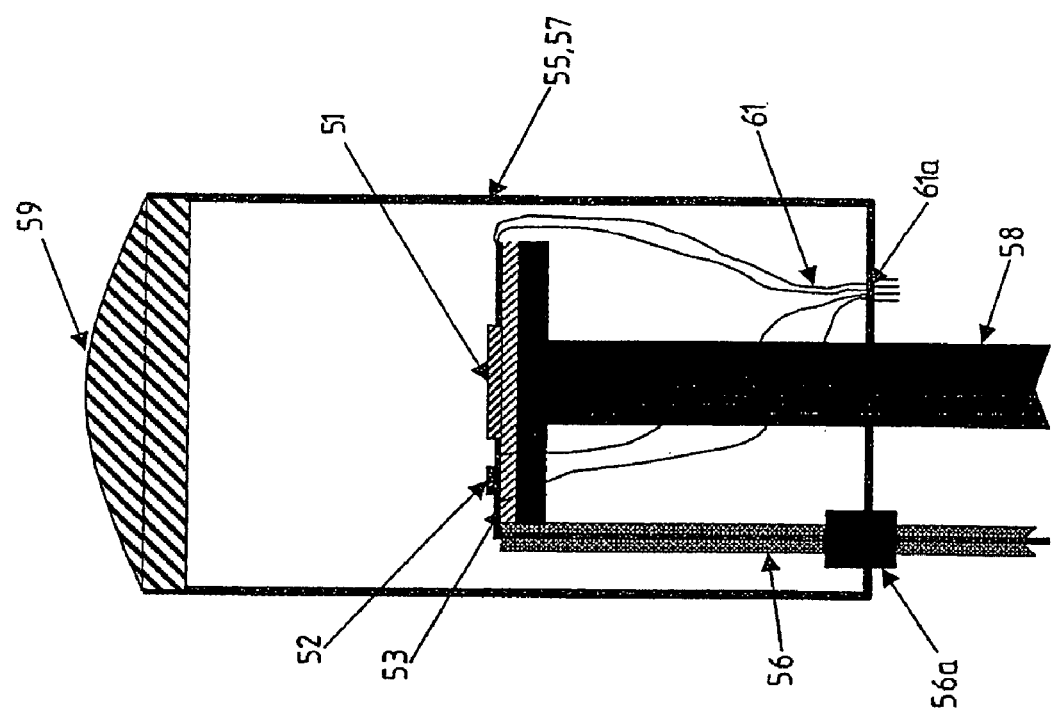
FIG. 6 shows a diagrammatic illustration of an antenna structure having a vacuum chamber.

FIG. 6 shows an exemplary embodiment in which the thermal insulation 57 is designed as a metallic vacuum chamber 55. The superconducting quantum interference filter is located on a chip that is mounted on the cooling finger 58 of an active cooler. It is connected to a low temperature transistor 52 via a microstripline. The amplified signal is fed into a waveguide 56 via the microstripline 53 and led to the consumer. The lines 61 serve the purpose of supplying the circuit with operating and control currents and voltages. The vacuum feed through 61a is designed as a glazed bushing.

The first part of the primary antenna structure is composed of a dielectric lens 59 that serves simultaneously as vacuum window. The incident wave is focused directly onto an onchip antenna structure that is coupled directly to the superconducting quantum interference filter. Given appropriate design of the vacuum chamber as waveguide, and thus as further part of the primary antenna structure, it is thus possible to prevent the propagation of parasitic modes. The integration of the low temperature transistor directly in the case of the superconducting quantum interference filter has, besides the very low inherent noise of the system, the additional advantage that the losses necessarily occurring at the vacuum feed through 56a of the waveguide 56 do not worsen the signal-to-noise ratio.

Figure 7A:
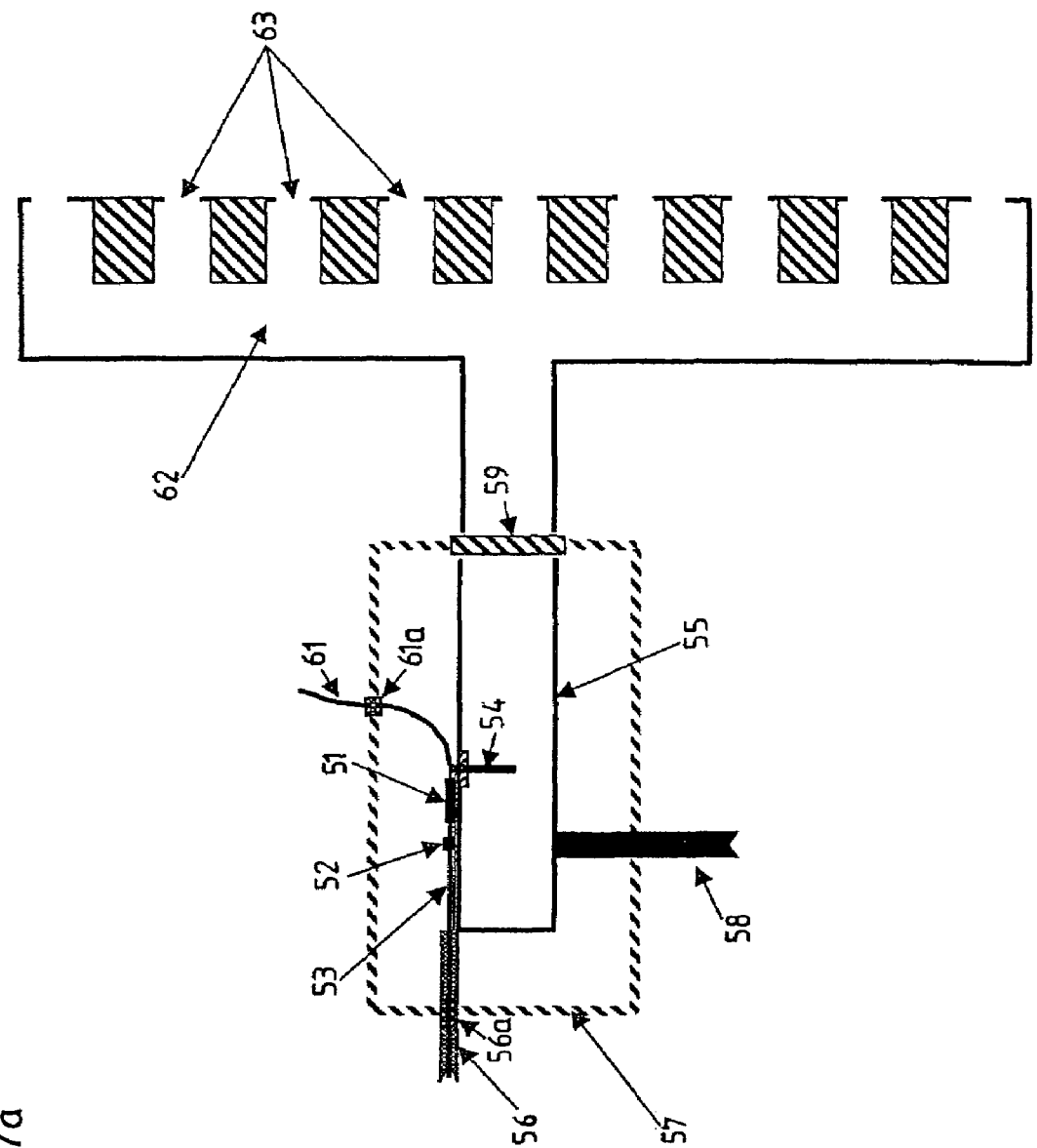
FIG. 7a shows an embodiment comparable to FIG. 5 but having an array of aperture antennas.

FIG. 7a is a sketch of an embodiment in which the primary antenna structure is composed of an array of aperture antennas 63, a hollow conductor structure 62 that assembles the signals of the individual aperture antennas, and a hollow conductor termination 55 with decoupling pin 54. The space required by this design is typically substantially less than the space required for the exemplary embodiment of FIG. 5.

Figure 7B:
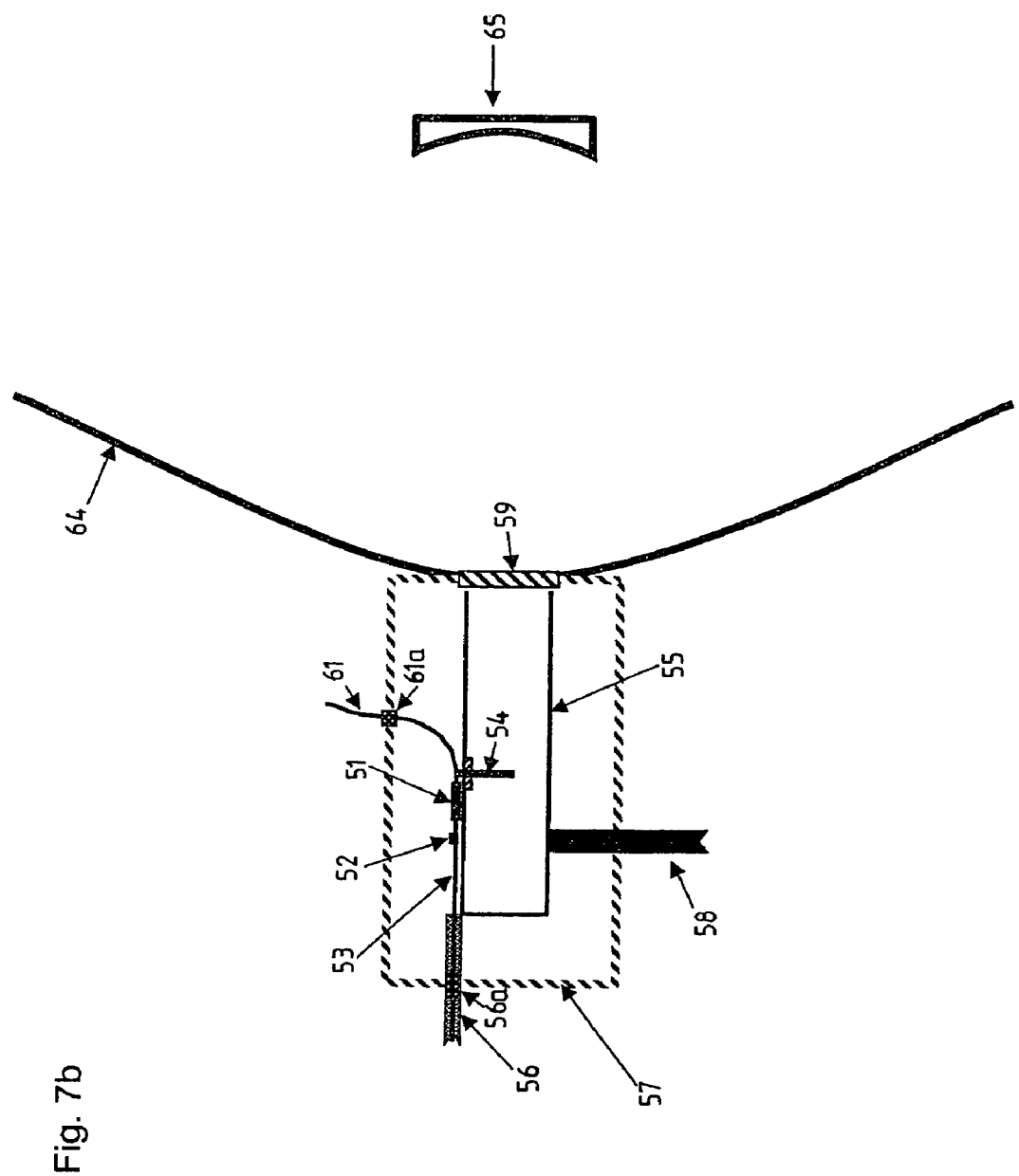
FIG. 7b shows an embodiment in an illustration corresponding to FIG. 7a an antenna having a parabolic mirror.

In FIG. 7b, a part of the primary antenna structure is designed as a parabolic mirror 64 at whose focus there is located a further, small mirror 65, which focuses the incident wave onto the hollow conductor termination 55. The high frequency window 59 is located at the center of the parabolic mirror 64. This embodiment has the advantage that shading and diffraction effects can be kept very small by means of the secondary mirror 65. Also possible, however, are embodiments in which the circuit and the hollow conductor termination themselves are mounted correspondingly at the focal point of the parabolic mirror.

Figure 8:
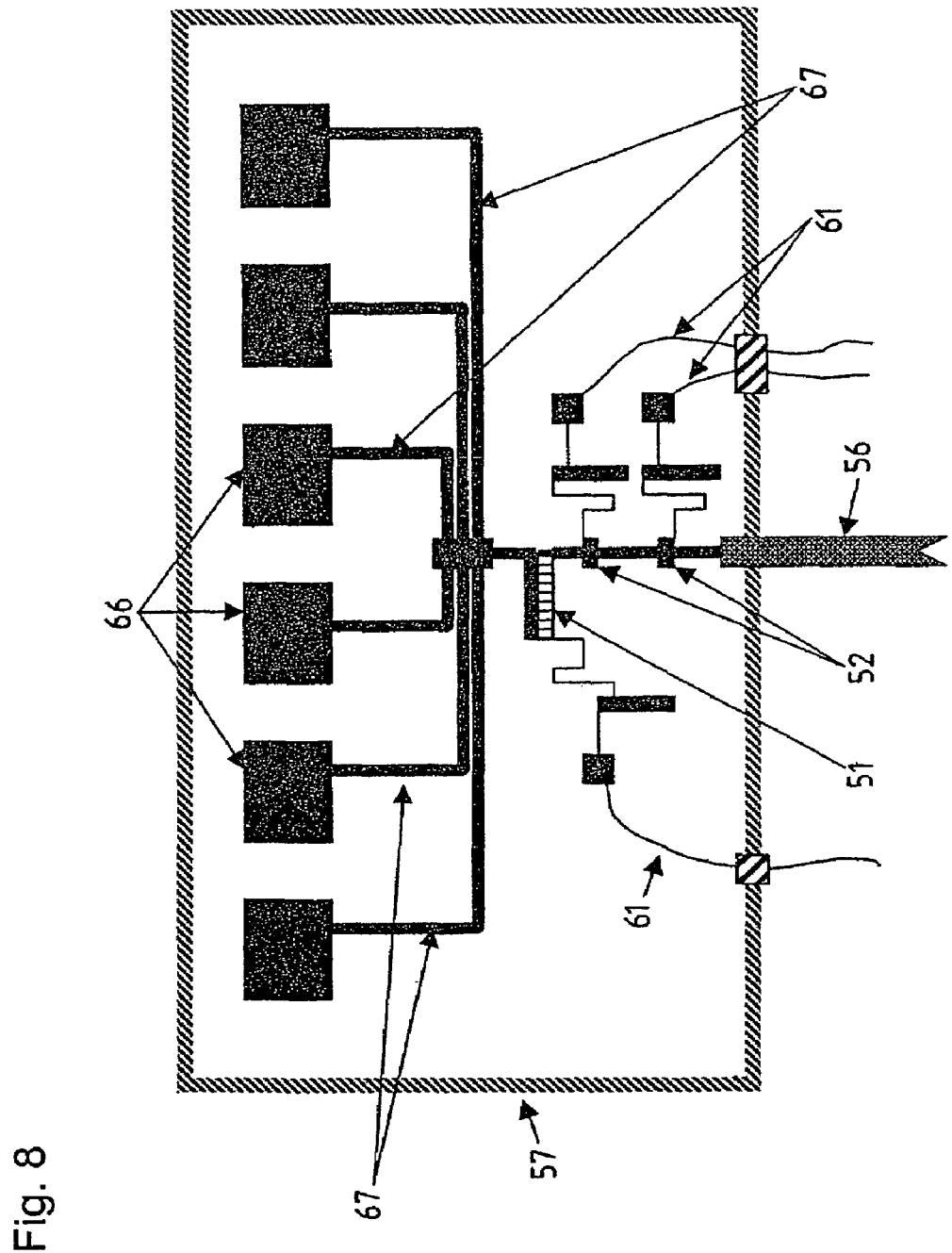
FIG. 8 shows an embodiment of an antenna having an array of patch antennas, in a diagrammatic illustration, FIGS. 9a and b show a multicell SQIF of parallel-connected Josephson junctions, in a spatial arrangement.

FIG. 8 shows an exemplary embodiment in which the primary antenna structure is composed of an array of patch antennas 66 and microstriplines 67 that assemble the signals of the individual patch antennas. The assembled signals are fed into a superconducting quantum interference filter 51 whose output is connected to a two-stage transistor amplifier 52. The output signal of the circuit is fed into a waveguide 56. The operating currents and voltages are fed to the active components via the lines 61 and capacitors and inductors. In this exemplary embodiment, the entire circuit and the entire primary antenna structure are located in a thermal insulation 57. The coupling to the cold reservoir is typically performed from below, while the high frequency window is located above the antenna array.

Figure 9A:
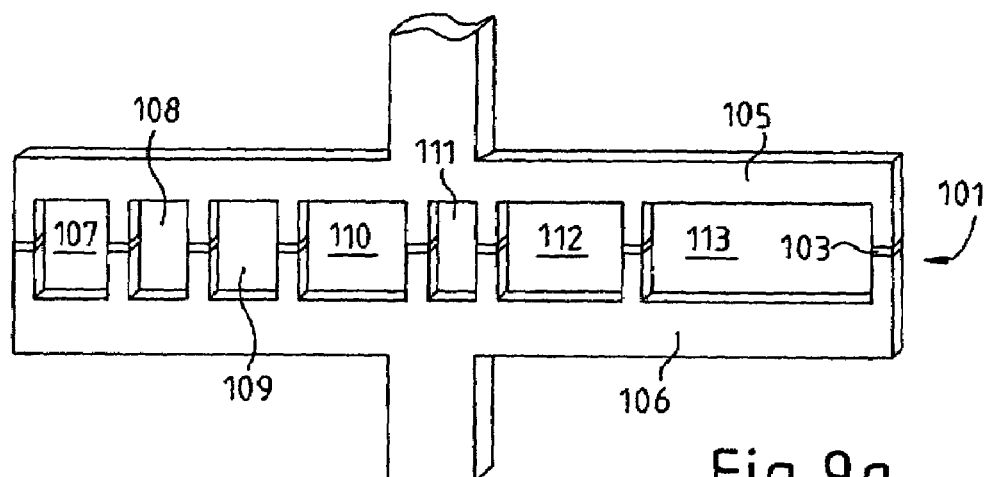
Figure 9B:
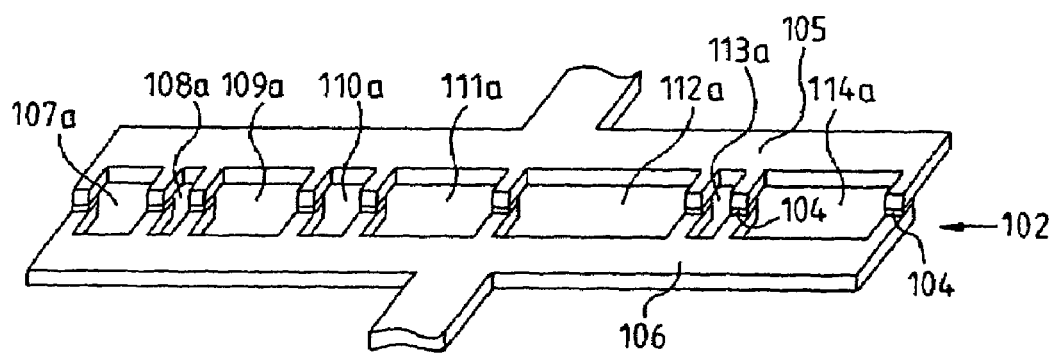

The exemplary embodiments for a SQIF sketched in FIG. 9 are explained below in more detail. The illustrations in accordance with FIGS. 9a and 9b show the physical realizations of simple multiloop networks 101, 102 with Josephson junctions 103, 104 whose geometry and detection response constitute superconducting quantum interference filters. The networks 101, 102 comprise superconducting regions 105, 106 which are interconnected by the Josephson junctions 103, 104. The superconducting regions can in this case consist both of low-temperature superconducting materials and of high-temperature superconducting materials. Again, the operability of the network does not depend on the specific design of the Josephson junctions (for example break junctions, step junctions, microbridges, etc.). The quantitative data for the exemplary embodiments relate, for example, to the parameter specifications of the typical Josephson junctions corresponding to the prior art and made from conventional superconductors, for example Josephson junctions produced using $Nb/A10_x/Nb$ technology such as are used in a conventional SQUID magnetometer. Such junctions have typical critical currents $i_c$ of approximately 200 μA and a normal resistance $r_n$ which is defined by an ohmic resistor, connected externally in parallel, of, for example, approximately 1Ω, and a geometrical shunt capacitor $c_n$ in the picofarad range. The spatial extent of the network can be comparable to the conventional SQUIDs. The dimensions of the cells of the network are then in the range of μm to mm. However, depending on application, SQIF networks can also have cells with larger or smaller dimensions.

Figure 10:
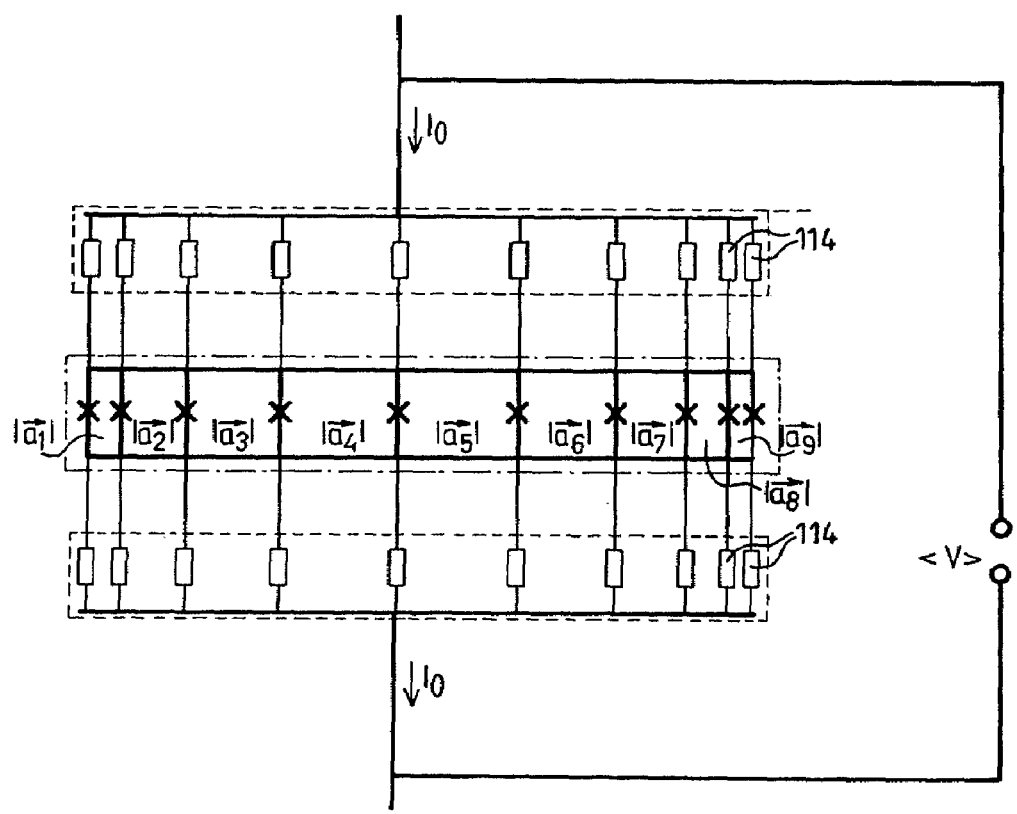
FIG. 10 shows the circuit diagram of an equivalent superconducting circuit of a quantum interference filter with N=10 junctions.
Figure 11:
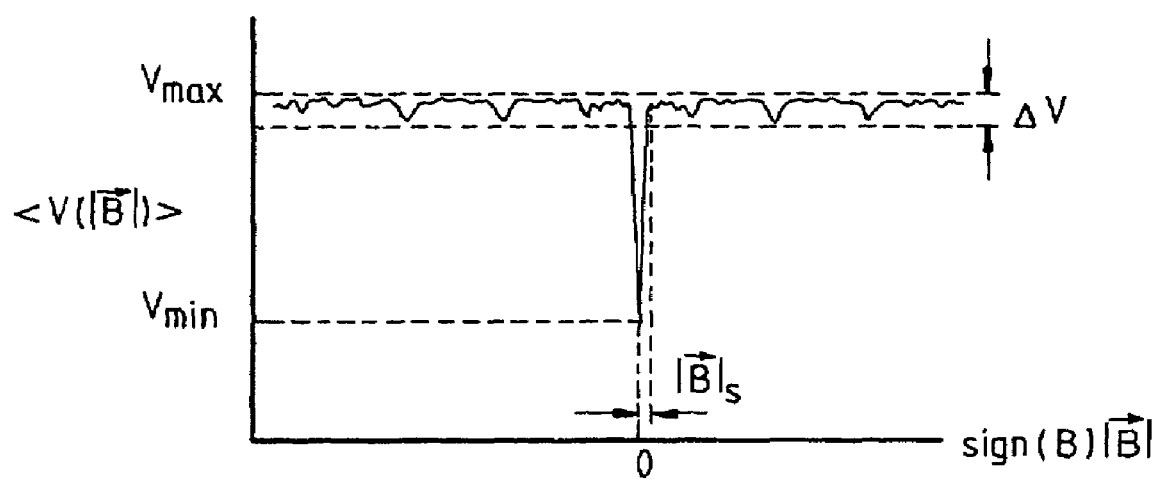
FIG. 11 shows a voltage response function for a SQIF with N=30 junctions, FIGS. 12a and b show periodic voltage response functions for conventional SQUIDs.

In FIGS. 9a and 9b, the superconducting quantum interference filter is made up of a flat network 101, 102 made from Josephson junctions 103, 104, which has cells 107 to 113 or 107a to 114a, which in each case have two contacts in the current direction. The circuit diagram of the equivalent superconducting circuit of a SQIF with N=10 contacts is illustrated in FIG. 10. The network is characterized in that the individual areas of cells 101 to 109 are of different size, and the surface areas $/a_j/$ of the various network cells are not in a rational ratio to one another. 114 denotes equivalent resistors. The cross marks the Josephson junctions 101 to 110. The dashed and dotted box around the Josephson junctions indicates the region connected in a superconducting fashion. The bold lines inside this box symbolize superconducting connections. Under these preconditions, in particular, the physical effect of multiple macroscopic quantum interference arises in such a way that the quantum mechanical wave functions which describe the state of the individual superconducting regions of the network interfere constructively only when the magnetic flux permeating the network vanishes identically. The macroscopic overall state of the network can be read out by virtue of the fact that the network is driven by a constant or a time-variant supercritical current $\vec{I}_0$. The result is a voltage response function $\langle V(\vec{B};I_0)\rangle$, which has only a global absolute minimum at $|\vec{B}|=0$ and rises monotonically with increasing $|\vec{B}|$ until, finally, a value $V_{max}(\vec{B};I_0)$ which remains approximately constant is reached, said value no longer changing substantially as $|\vec{B}|$ continues to increase, as is illustrated diagrammatically in FIG. 11 for a network with N=30 junctions. The voltage response function of the superconducting quantum interference filter is thereby unique for a magnetic field $\vec{B}$ with $0<|\vec{B}|<\vec{B}|_s$ present at the location of the network. The result for $|\vec{B}|>\vec{B}|_s$ is a voltage response fluctuating close to $V_{max}$ whose variance quickly becomes smaller with increasing N, $V_{max}$ being the global absolute maximum of the voltage response function (compare FIG. 11). The measuring range of the superconducting quantum interference filter is determined by the spacing between the global minimum $V_{min}=\langle V(|\vec{B}|=0;I_0)\rangle$ and $V_{max}-\Delta V$, $-\Delta V$ designating the spacing between the smallest local minimum for $|\vec{B}|>|\vec{B}|_s$ and $V_{max}$. The value $|\vec{B}|=0$ therefore defines the lower bound of the measuring range, and the value of $|\vec{B}|$, at which the voltage response reaches the value $V_{max}-\Delta V$, defines the upper bound $|\vec{B}|_s$ of the measuring range (compare FIG. 11). The value of $\Delta V$ depends in this case on the number of the cells which the network has, and on the selection of the surface areas of the individual network cells or on their ratios to one another. This is explained in more detail in the theoretical description, following in the next paragraph, of the superconducting quantum interference filter.

Sketched in FIGS. 10b to f are embodiments of networks in which the individual network cells comprise a further junction or a plurality of further junctions in addition to the two functionally required junctions 103 in accordance with FIG. 10a. The junctions are denoted in this case as crosses. The bold lines mark superconducting connections. The thin lines can be normally conducting or superconducting. The additional junctions can be provided in this case in the individual network cells in such a way that none or only a small part of the driving current flows through them (not directly energized junctions 103a) and, on average, there is also no time-variant voltage drop. The screening currents induced by a magnetic field in the individual cells can be reduced by such embodiments. Furthermore, the influence of self-inductances and mutual inductances can be reduced thereby. The additional junctions can, however, also be provided such that they are flowed through by the driving current I (directly energized junctions 103b). Also possible is a combination of one junction 103a or a plurality of junctions 103a and one junction 103b or a plurality of junctions 103b in individual cells or a plurality of cells of the network.

Figure 12A:
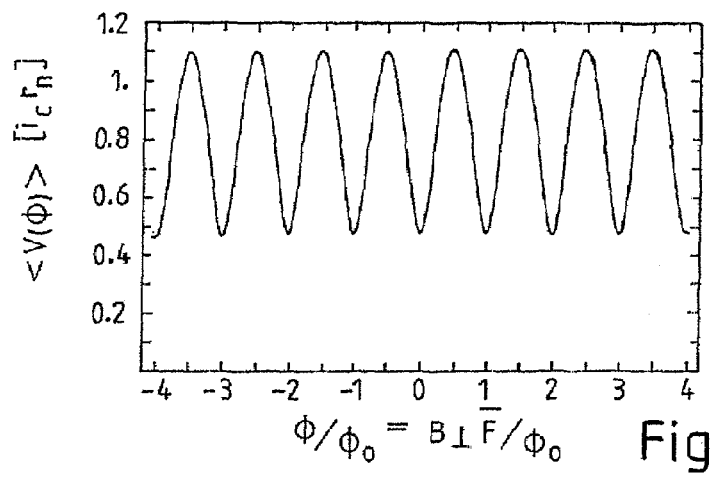
FIG. 12c shows the voltage response function of a superconducting quantum interference filter.
FIG. 12d shows the voltage response function of a SQUID and a SQIF.
Figure 12B:
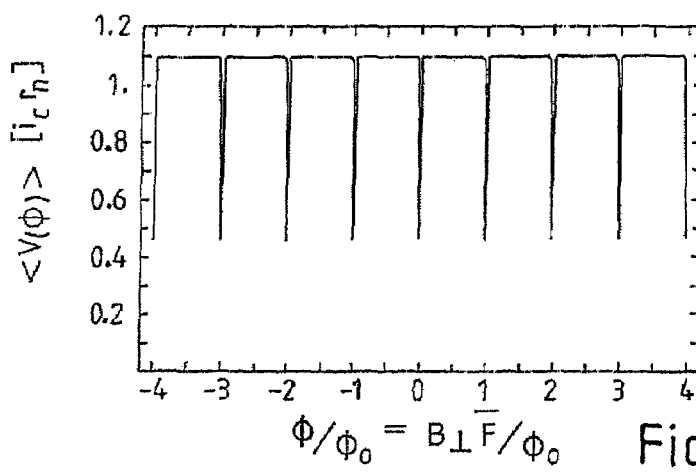
Figure 12C:
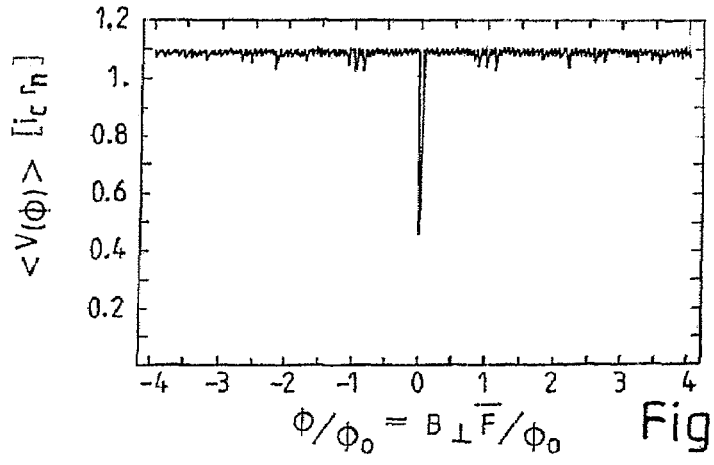
Figure 12D:
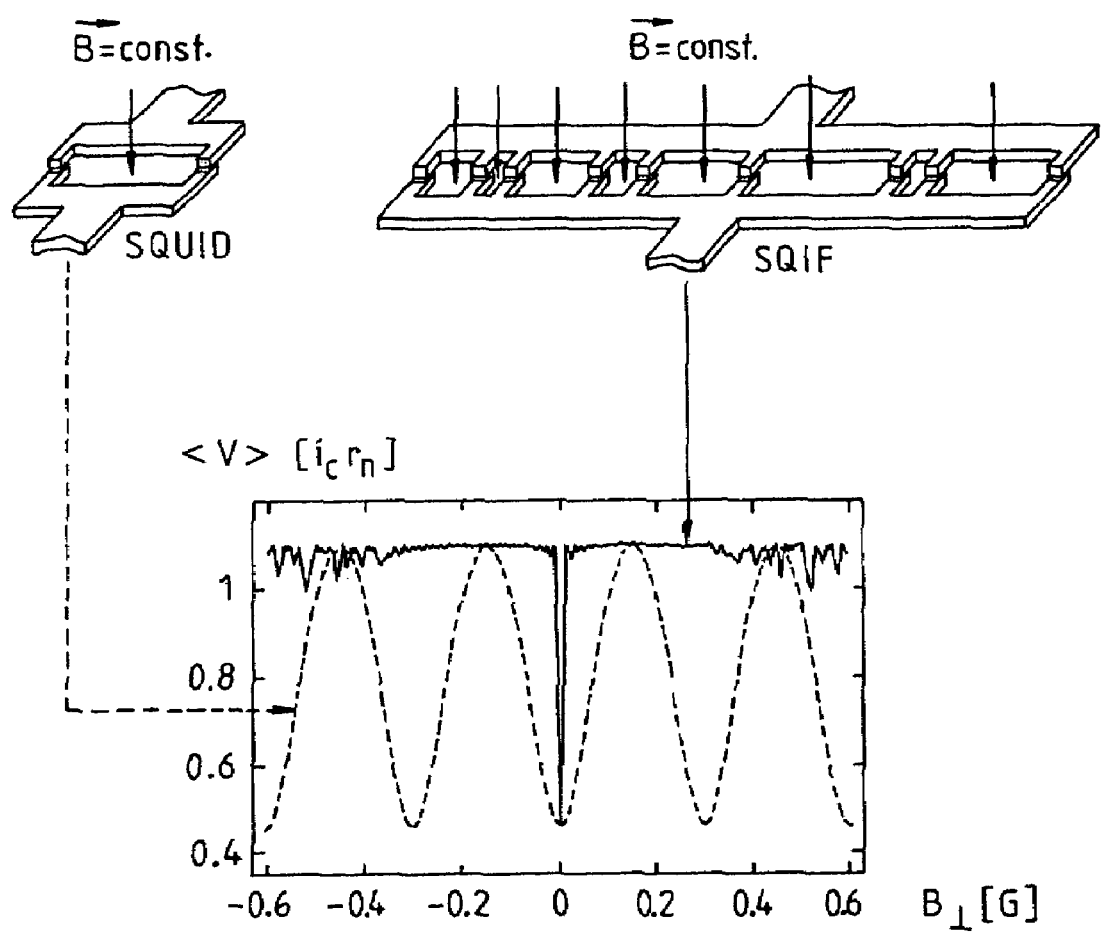

Illustrated in FIGS. 12a to 12c for the purpose of direct comparison is the voltage response function of a conventional single-loop SQUID (FIG. 12a), of a conventional multiloop SQUID with regular standard cells of identical size (FIG. 12b) and of a superconducting quantum interference filter (FIG. 12c). Said example of a single-loop SQUID comprises a single superconducting loop or a cell with two Josephson junctions, the multiloop SQUID made from a parallel arrangement of such identical single-loop SQUIDs ("conductor array") with N=30 junctions, and the superconducting quantum interference filter likewise has N=30 junctions. The driving current $\vec{I}_0$ is selected for all three arrangements such that for $|\vec{B}|=0$ the current per junction has the value 1.1 $i_c$, and so the voltage range $V_{max}-V_{min}$ is the same for all three devices. The voltage response functions of a conventional SQUID and a SQIF are illustrated once again with the aid of a concrete exemplary embodiment in FIG. 12d. Whereas single-loop SQUIDs and multiloop SQUIDs have a periodic voltage response function <V> of period $\Phi_0$ in such a way that no absolute measurement of the magnetic field is possible, the flat superconducting quantum interference filter has a unique voltage response function. This voltage response function of the SQIF thereby permits absolute quantitative measurement of the magnetic field. In the example selected, the measuring range is between $\Phi=0$ and $\Phi\equiv B_\perp F\approx 0.02\Phi_0$. Given a mean network cell area $F$ in the range of $\mu m^2$, this corresponds to magnetic field strengths of between $B_\perp=0$ and $B_\perp=10^{-4}$ T and for $F$ in the range of $mm^2$ magnetic field strengths of between $B_\perp=0$ T and $B_\perp=10^{-10}$ T. In these examples, the limit of resolution can be in the range from $10^{-13}$ T to $10^{-16}$ T.

The measuring range of the device according to the invention can be varied as desired in conjunction with a constant sensitivity by using a compensation circuit with the aid of which a magnetic flux of known strength is coupled into the superconducting quantum interference filter in a controlled fashion.

The electrotechnical theoretical description of the superconducting quantum interference filter can be performed with the aid of what is known as the RCSJ model (RCSJ=Resistively and Capacitively Shunted Junction) for the individual Josephson junctions taking account of the network theory for superconducting circuits. In the RCSJ model, the individual Josephson junction is described by a nonlinear inductor which is connected in parallel with an ohmic shunt resistor $r_n$ and a geometrical shunt capacitor $c_n$ characterizing the tunnel barrier. The description of the macroscopic state of the Josephson junctions is performed by the calibration-invariant difference between the macroscopic quantum mechanical phases at the two opposite superconducting electrodes of the respective junction. This phase difference is designated by $\phi_j$, j=1 ... N indicating the individual junctions of the network. The relations on which the network dynamic is based are then given by $$I_j = i_c \sin(\phi_j) + \frac{v_j(t)}{r_n} + c_n \partial_t v_j(t), \quad (1)$$

$$v_j(t) = \frac{\hbar}{2e} \partial_t \phi_j, \quad (2)$$

$$\phi_{j-1} - \phi_j = 2\pi \frac{\Phi_j}{\Phi_0}, \quad (3)$$

$I_j$ denoting the current, flowing through the junction with index j, with $$\sum_{j=1}^{N} I_j = I_0$$

and $\Phi_j$ denoting the magnetic flux penetrating the network cell with index j. Equation 1 describes the nonlinear relation between the current $I_j$ and the voltage $v_j(t)$ dropping across the junction in the RCSJ model. Equation 2 corresponds to the second Josephson relation, in accordance with which the voltage $v_j(t)$ dropping across the junction is directly proportional to the time derivative $\partial_t \phi_j$ of the phase difference $\phi_j$. Equation 3 is an expression of the quantization of the magnetic flux through a closed superconducting loop.

For the sake of simplicity, it is assumed in the theoretical description that the network junctions are identical, that is to say that both the critical currents $i_c$ and the parallel-connected shunt resistors $r_n$ and shunt capacitors $c_n$ are not subject to statistical or systematic scattering. The occurrence of typical manufacturing-induced instances of parameter scattering does not, however, impair the serviceability of the superconducting quantum interference filter. The theoretical description within the framework of the RCSJ model is, moreover, limited to what are called point junctions, that is to say to junctions which are so small that the phase differences do not vary over the extent of the junction barrier. This is also the customary assumption in the theoretical description of conventional SQUIDs. This assumption is particularly justified in superconducting quantum interference filters, since, by contrast with conventional SQUIDs, with increasing number of the network cells, the interference patterns occurring are dominated by the network dynamics and therefore depend only extremely weakly on the specific geometry of the individual junctions.

The network equations following from the current conservation and Equations 1 to 3 link the magnetic field $\vec{B}$ acting at the location of the network, and the driving current $I_0$, with the voltage $V(t)$ dropping across the circuit. For magnetic fields $\vec{B}$ which are static or vary slowly by comparison with the network frequency, the network equation for SQIF of this exemplary embodiment, and in general for SQIFs which comprise parallel-connected network cells, can be written as a nonlinear differential equation of the form $$\frac{\hbar}{2e} \frac{c_n}{i_c} \partial_t^2 \phi_1 + \frac{\hbar}{2ei_c r_n} \partial_t \phi_1 + |S_N(\vec{B})|\sin(\phi_1 + \delta_N) = \frac{I_0}{N i_c} \quad (4)$$

$$v_1(t) = \frac{\hbar}{2e} \partial_t \phi_1, \quad (5)$$

the magnetic field $\vec{B} = \vec{B}_{ext} + \vec{B}_c$ being composed of the primary external field $\vec{B}_{ext}$ to be measured and, possibly, a secondary magnetic compensation field $\vec{B}_c$ produced in a controlled fashion. The complex ($i=\sqrt{-1}$) structural factor $S_N(\vec{B}) = |S_N(\vec{B})| \exp[i\,\delta_N(\vec{B})]$ occurring in Equation 4 describes the geometrical and dynamic properties of the superconducting quantum interference filter composed of N−1 cells. It determines the spatial and temporal interference properties of the network as a function of the strength of the magnetic field to be measured. The phase shift $\delta_N$ likewise depends on the specific geometry of the arrangement, but has no influence on the time-averaged voltage response function $\langle V(\vec{B};I_0)\rangle$.

The complex structural factor $S_N(\vec{B})$ is defined as $$S_N(B) = \frac{1}{N} \sum_{n=0}^{N-1} \exp\left(\frac{2\pi i}{\Phi_0} \sum_{m=0}^{n} \langle \vec{B}, \vec{a}_m \rangle \right) \quad (6)$$

the vectors $\overline{a_m}$ denoting the oriented surface elements $$\left(\frac{\vec{a}_m}{|\vec{a}_m|} = \text{surface normal},\right.$$

$|\vec{a}_m|$=surface area of the mth loop) of the individual network loops, and $\overline{a}_0 = 0$. It therefore holds for the magnetic flux permeating the individual network loops that $\Phi_m = \langle \vec{B}, \vec{a}_m \rangle$, the scalar product being defined for any two vectors $\vec{a}$, $\vec{b}$ by $\langle \vec{a}, \vec{b} \rangle = |\vec{a}||\vec{b}| \cos \angle(\vec{a}, \vec{b})$. If the magnetic field $\vec{B}$ varies over the extent of the loop, the corresponding integral representation then occurs at the point of this scalar product. The periodicity of the network is determined by the accumulated magnetic fluxes $$\alpha_n = \sum_{m=0}^{n} \langle \vec{B}, \vec{a}_m \rangle \quad (7)$$

with n=0 ... N−1.

For conventional single-loop SQUIDs, in which only one oriented area $\vec{a}_1$ exists, with N=2 $S_N$ assumes the value $$S_2 = \frac{1}{2}\left(1 + \exp\left[\frac{2\pi i}{\Phi_0}\Phi\right]\right) \text{ and } |S_2| = \cos\left(\frac{\pi \Phi}{\Phi_0}\right).$$

For flat periodic multiloop SQUIDs with identical loop surfaces $\vec{a}_1 = \vec{a}_2 = \vec{a}_3 = \ldots = \vec{a}_{N\pm 1}$, $\alpha_n = n\Phi$ with $\Phi = B_\perp |\vec{a}_1|$ and so $$S_N = \frac{1}{N} \sum_{n=0}^{N-1} \exp\left[\frac{2\pi i}{\Phi_0} n\Phi\right]$$

is a geometric series, the result being $$|S_N| = \frac{\sin(N\pi\Phi/\Phi_0)}{N\sin(\pi\Phi/\Phi_0)}.$$

The structural factors for such conventional SQUIDs corresponding to the current state of the art therefore have periodic structural factors independently of the number of junctions. These periodic structural factors are the cause of the likewise strongly $\Phi_0$-periodic voltage response functions $\langle V(\vec{B};I_0)\rangle$ of such devices, and thus the cause of the fact that no absolute measurement of the magnetic field is possible with the aid of such devices corresponding to the prior art. Superconducting quantum interference filters have, by contrast, no periodic structural factors, since $S_N(\vec{B})$ according to Equation 6 cannot be periodic for incommensurable accumulated magnetic fluxes $\alpha_n$. Superconducting quantum interference filters therefore also have no periodic voltage response functions $\langle V(\vec{B};I_0)\rangle$ and therefore permit the absolute measurement of magnetic fields.

According to Equation 3, it holds for external fields which are static or vary slowly by comparison with the network frequency that $v_j(t)=v_1(t)$ for all $j=1 \ldots N$, that is to say $v_1(t)$ defines the AC voltage dropping across the superconducting quantum interference filter. The network frequency $\phi$ is related via the Einstein relation $h\nu=2e\langle V(\vec{B};I_0)\rangle$ to the time average of this AC voltage, the voltage response function $$\langle V(\vec{B};I_0)\rangle = \frac{1}{T}\int_0^T v_1(t)\,dt, \text{ where } T = \frac{1}{\nu}.$$

For typical Nb|AlO$_x$|Nb Josephson junctions, the network frequency $\phi$ is approximately 100 GHz, and so the frequency $\phi_{ext}$ for the external field can be in a range from $\phi_{ext}=0$ to approximately 20 GHz. As in the case of conventional SQUIDs, the DC voltage $\langle V(\vec{B};I_0)\rangle$ dropping across the network on average over time can serve as easily accessible measured variable. The influence of inductances and self-fields caused by the driver current is neglected in Equations 4 and 5 in order to improve comprehension. In fact, given a suitable design of the superconducting quantum interference filter, conductances and self-fields can be minimized such that its serviceability is not impaired by these influences. Appropriate devices are presented in the further exemplary embodiments.

Neglecting the shunt capacitors $c_n$, something which is justified to a very good approximation for typical Josephson junctions, permits an analytical solution for the voltage response function:

$$\langle V(B;I_0)\rangle = i_c r_n \sqrt{\left(\frac{I_0}{NI_c}\right)^2 - |S_N(B)|^2} \quad (8)$$

As is sketched in FIG. 12a, this voltage response function is periodic with period $\Phi_0$ for all SQUIDs corresponding to the present state of the art. By contrast, for SQIFs the voltage response function is not periodic. This is illustrated in FIG. 12c. The voltage response function of the superconducting quantum interference filter has a minimum for $\Phi=0$, like the voltage response function of conventional SQUIDs. By contrast with conventional SQUIDs, this minimum is not, however, repeated in the case of an increasing external field. The voltage response is therefore uniquely distinguished for $\Phi=0$ and, depending on design, permits absolute quantitative measurement of the external magnetic field directly or with the aid of a suitable compensation circuit for the magnetic field. Since the absolute value of the structural factor $S_N$ features quadratically in Equation 8, the voltage response function for the SQIFs fluctuates in the top part of the graph only very slightly about the value $V_{max}$ and the result is a decidedly steep edge between $V_{min}$ and $V_{max}$ (compare FIG. 12c).

The structural factor $S_N(\vec{B})$ of the superconducting quantum interference filter can be optimized in such a way that the voltage response function $\langle V(\vec{B};I_0)\rangle$ has a maximum measuring range of $0<|\vec{B}|<|\vec{B}|_s$. This is the case whenever the spacing $\Delta V$ between the smallest local minimum of V and the maximum voltage value $V_{max}$ is minimized for a given total area $$\sum_{m=1}^{N-1} |\vec{a}_m|$$

(compare also FIG. 11) and given number of network contacts N in the operational range. The maximum operational range of a superconducting network is determined in this case by the maximum achievable compensation field strength.

For flat networks, the case can arise in which a minimum possible length variation $l_0$ of the conductor tracks occurs which is caused by the production process. The surface areas $|\vec{a}_m|$ of the network loops can then be defined by $|\vec{a}_m|=q_m l_0^2$, the numbers $q_m$ being positive whole numbers. In the most unfavorable case, two surface elements can therefore differ only by the absolute value of $l_0^2$ for production reasons. This has the result that the structural factor $S_N(\vec{B})$, and thus the voltage response function $\langle V(\vec{B};I_0)\rangle$ of the superconducting quantum interference filter, could vary periodically from a purely theoretical viewpoint. However, the period which possibly arises is very large with reference to $\Phi_0$ and corresponds to $$\frac{\Phi_0}{GGT} A_{tot},$$

where GGT is the highest common factor of the absolute values $|\vec{a}_m|$ of the oriented surface elements of a planar network, and $A_{tot}$ denotes the total area of the SQIF, $$A_{tot} = \sum_{m=1}^{N-1} |\vec{a}_m|.$$

A typical value, corresponding to the prior art, for $l_0$ is approximately one hundred nm (niobium process). The minimum area difference $l_0^2$ is therefore of the order of magnitude of $10^{-2}$ μm² in the case of an assumed network cell area of the superconducting quantum interference filter of $10^{-2}$ mm². If the numbers $q_m$ are now themselves coprime, for example because they are selected in relation to (different) prime numbers, the period of the voltage response function is given as $$\frac{\Phi_0}{l_0^2} A_{tot}.$$

For typical total areas $A_{tot}$ of several 1000 μm², this period is far outside the practically relevant measuring or operational range. Consequently, for an operational range given in a specific application, there is always a superconducting quantum interference filter with an optimum area, number of junctions and associated structural factor.

Figure 13:
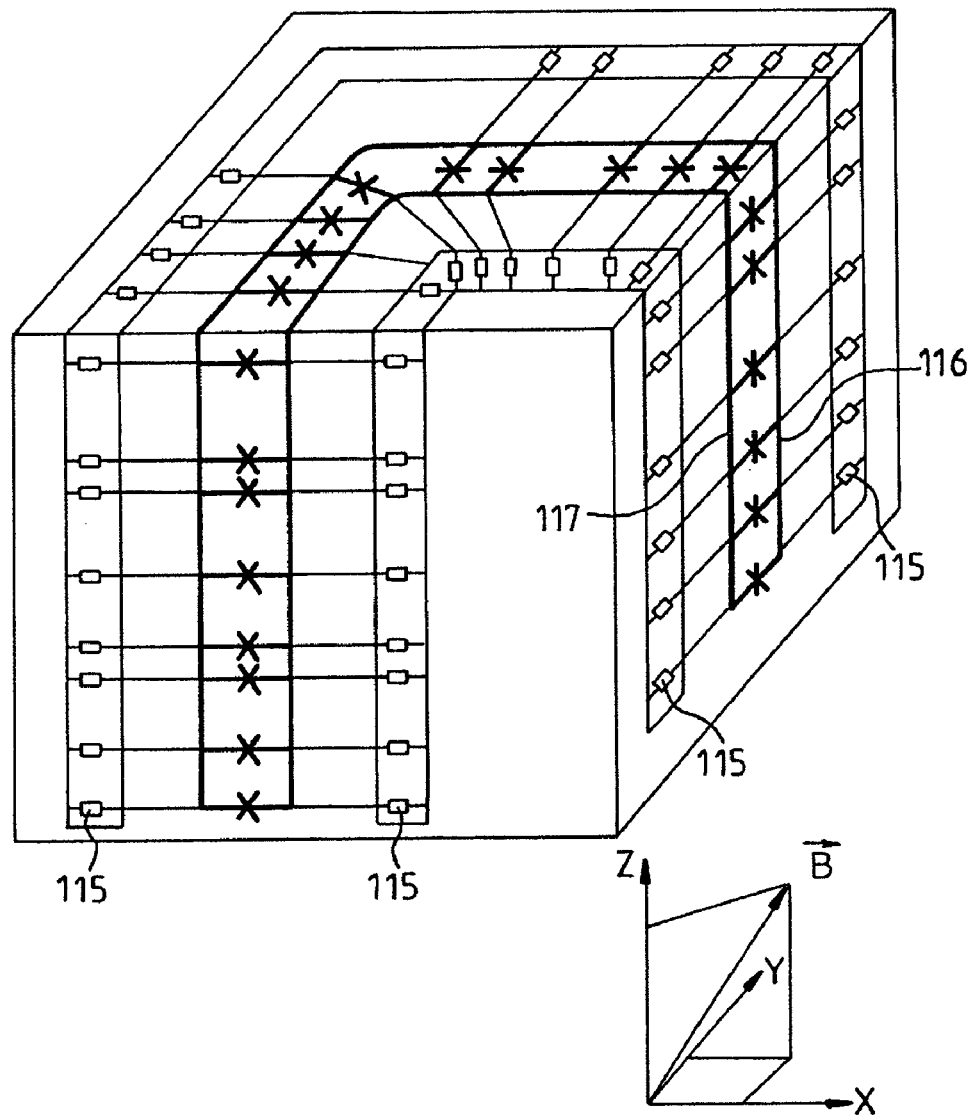
FIG. 13 shows a symbolically illustrated spatial arrangement of a superconducting quantum interference filter with an indication of the vector basis of the three-dimensional space.

A further exemplary embodiment of the invention is illustrated in FIG. 13. The network cells fall here into three groups in such a way that a complete vector basis of three-dimensional space can be formed from the oriented surface elements $\vec{a}_m$. This design of the invention, which is denoted below as vector SQIF, has the advantage that both the strength and the direction of the primary magnetic field to be measured can be determined uniquely and with very high accuracy by means of appropriately designed compensation fields which, for example, each generate a controllable secondary field parallel to each of the base vectors formed from the $\vec{a}_m$. This permits the unique quantitative reconstruction of the primary magnetic field vector $\vec{B}_{ext}$ in terms of absolute value, direction and phase, and allows a multiplicity of novel applications. For example, it is even possible with two such arrangements exactly to localize the sources of a magnetic field and to determine their strength. This can include the wireless readout of detector fields when the individual detector signals comprise temporary electric currents. Again, reading out or processing electronic or magnetic data memories is possible with such arrangements in the GHz to THz range in conjunction with a very high temporal resolution and thus an extremely fast processing rate, this being done in a contactless fashion and virtually without consuming or dissipating power. Further examples of the application of such vector SQIFs are the spatial and temporal high-resolution measurement of metabolic processes, for example in the human brain, of signals in nuclear magnetic resonance or the magnetic field distribution in the upper earth crust such as, for example, in geological exploration. The crosses in FIG. 13 symbolize the Josephson junctions, and busbar resistors are denoted by the reference numeral 115. The thick bold lines illustrate superconducting connections. The two thick bold lines 116, 117 additionally delimit the part of the network connected in a superconducting fashion.

In an exemplary embodiment which is not illustrated, the vector SQIF is constructed from three individual flat SQIFs which operate independently of one another and whose surface normals form a vector basis of three-dimensional space. This device has the advantage that the individual flat SQIFs can be produced without any problem with the aid of the standard methods, corresponding to the current state of the art, of thin-film technology.

Quantitative measurement can be performed here either by simultaneous compensation of the three components of the external magnetic field, as in the exemplary embodiment of the last section, or by direct measurement of the voltage dropping across each individual SQIF. For specific applications, the latter measuring method is a further advantage of such arrangements, since there is then no need for compensation devices.

In two further exemplary embodiments which are not illustrated, the vector SQIF corresponding to the last or penultimate section is designed such that the surface normals of the individual SQIFs, or the oriented surface elements $\vec{a}_m$, are arranged in such a way that they can be used to form a complete vector basis of a two-dimensional subspace of the three-dimensional space. This design can be advantageous when the magnetic field is to be measured only in one plane, for example when flat detector fields or memories are involved.

Figure 14:
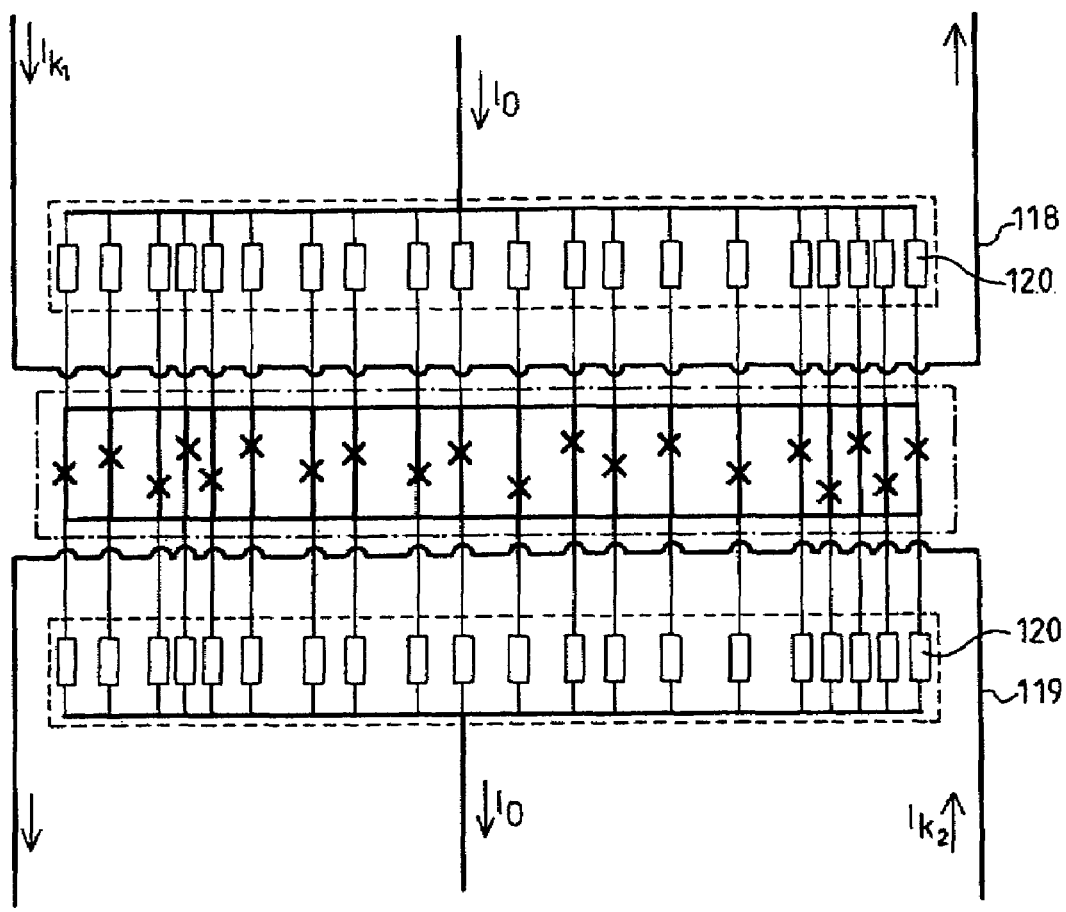
FIG. 14 shows a diagrammatically illustrated, flat superconducting quantum interference filter with a magnetic field compensation device.

FIG. 14 illustrates an exemplary embodiment of a flat SQIF in which the magnetic compensation field is produced by two control lines 118, 119 which are parallel to the network and therefore perpendicular to the direction of the driving current. If, in such an arrangement according to the invention, a current $I_{k1}$, $I_{k2}$ flows through one or both control lines 118, 119, a magnetic flux of known strength and capable of being controlled very precisely by this current is coupled into the cells of the SQIF. This flux can compensate the flux caused by an external magnetic field in such a way as to minimize the voltage dropping across the SQIF. This "operating point" is then always situated at the absolute minimum of the calibration curve $\langle V(\vec{B};I_0)\rangle$ of the SQIF. Since the spacing between the control line and network is known, the value of the compensation current can be used to determine directly the strength of the external magnetic field. The selection of another operating point within the measuring range of the SQIF is also possible. This design has the advantage that the operating range of the SQIF, that is to say the range of the magnetic field strengths which can be measured with the aid of the device, is bounded above in principle only by field strengths which destroy the phase coherence between the regions capable of superconducting which are separated by tunnel barriers. A further advantage is that in this design SQIFs can still be operated in a fully serviceable fashion even when the actual measuring range, that is to say the range in which the voltage response function is unique, is very small. This can occur whenever, owing to manufacturing tolerances, there occur, in the voltage response function, secondary minima whose voltage values do not differ very strongly from the voltage value of the absolute minimum. However, as long as the measuring range is larger than the resolution limit of the SQIF, which is typically a few nV, according to the invention the device remains fully serviceable in a design with a compensation circuit. Also advantageous in the case of a design with control lines is that the compensation circuit is provided on-chip and requires no additional production steps. According to the current prior art, in the case of thin-film structures the control lines can be provided in the layers situated above or below the network feeder lines. It can also be advantageous to provide a plurality of control lines, for example when for the purpose of precision measurements a temporally varying compensation field is to be superimposed on a static compensation field.

SQIFs should reach their maximum sensitivity for operation modes in which temporally varying compensation fields are used. Moreover, in such modes it is possible not only simultaneously to determine the strength and direction of the field to be measured, but also its phase angle. It is thereby possible to reconstruct the measured time-variant signal completely and therefore to make an identical copy of this signal. The advantage of the devices consists in that such copies can be amplified and passed on without any loss of information.

The crosses in FIG. 14 once again symbolize the Josephson junctions. Symbolically illustrated busbar resistors are denoted by the reference numeral 120. The dashed and dotted line describes the boundary of the necessarily superconducting part of the network.

In a design for precision measurements which is not illustrated, the compensation circuit is provided outside the SQIF and comprises a pair of coils which is orientated in such a way that the SQIF lies in a plane perpendicular to the axis of the pair of coils between the two coils. Such compensation circuits can have the advantage that the magnetic compensation field at the location of the SQIF has a very high level of homogeneity, and thereby permits extremely precise measurements. Designs in which compensation is local, that is to say performed by control lines and by compensation circuits provided outside the SQIF, can also be advantageous in minimizing the influence of interference, such as noise and fluctuations. SQIFs which have compensation circuits, for example in the form of control lines, can also be used as logic components (actuators) for superfast high-performance computers. SQIFs with two local control lines can provide OR logic modules which switch only when an exactly equal parallel current is flowing through both control lines. In this case, the switching times of such actuators are in the region of the network frequency, that is to say in the GHz to THz range. An advantage of such logic modules resides in this case also in the fact they simultaneously act as amplifiers, since even very small control currents lead to the maximum voltage response, which is several hundred µV to mV for present-day typical Josephson junctions.

Figure 15:
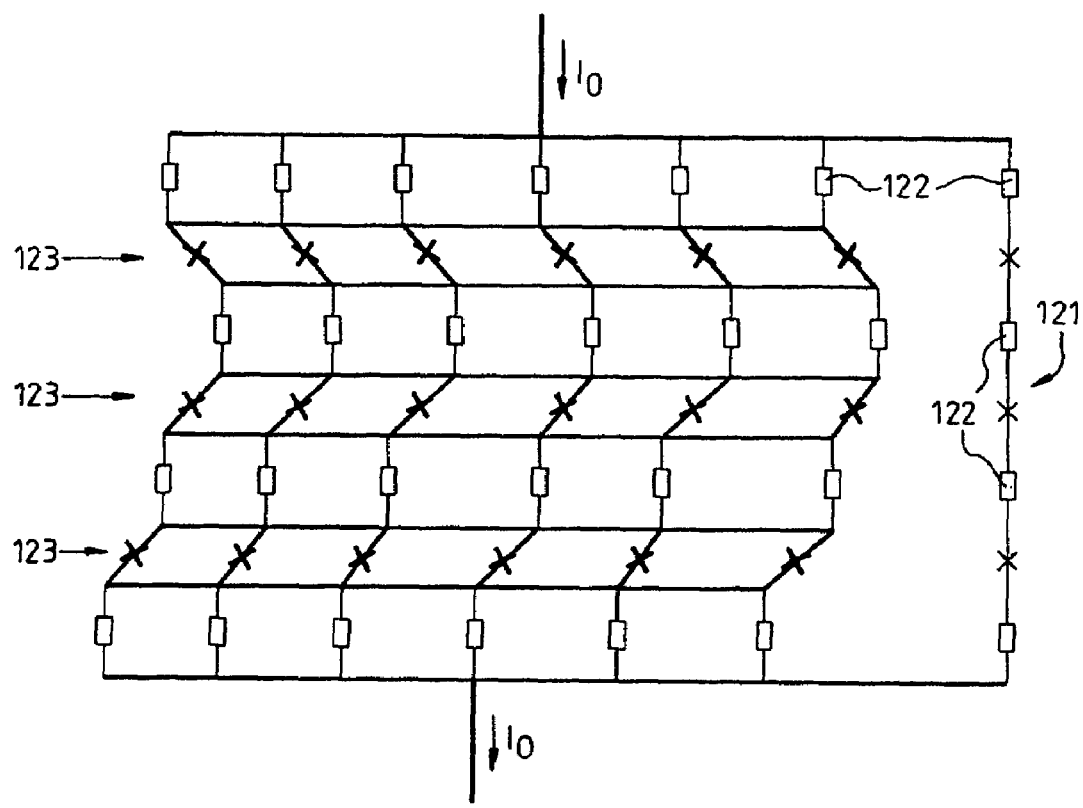
FIG. 15 shows a superconducting quantum interference filter with a parallel-connected control line, in a diagrammatic view.

The sensitivity or the gain of the arrangements according to the invention can be multiplied by a series connection of SQIFs, as is illustrated in FIG. 15, which are coupled to one another by an active control line 121 which, for its part, also contains Josephson junctions. The crosses symbolize Josephson junctions. Symbolically illustrated busbar resistors are denoted by the reference symbol 122. The bold lines inside the network represent superconducting connections and symbolize the superconducting region 123, which also contains the Josephson junctions.

The active control line 121 in this case synchronizes the one-dimensional SQIF array even in the case of strongly deviating structural factors of the various SQIF sections and parameter inhomogeneities. If the manufacturing tolerances are low, it is also possible in some circumstances to dispense with the active control line. The advantage of such SQIF arrays, which can also be designed in two dimensions, resides in the fact that the limit of resolution of the device decreases with the number of SQIF sections 123, and the gain grows with the number of SQIF sections. Given optimum selection of the mode of operation, it should be possible in the range of magnetic field measurement to use such arrangements to achieve, for example, limits of resolution which are many orders of magnitude lower than those in the case of conventional SQUID systems. Again, SQIF arrays can be produced without any problem using the production methods corresponding to the prior art.

Figure 16:
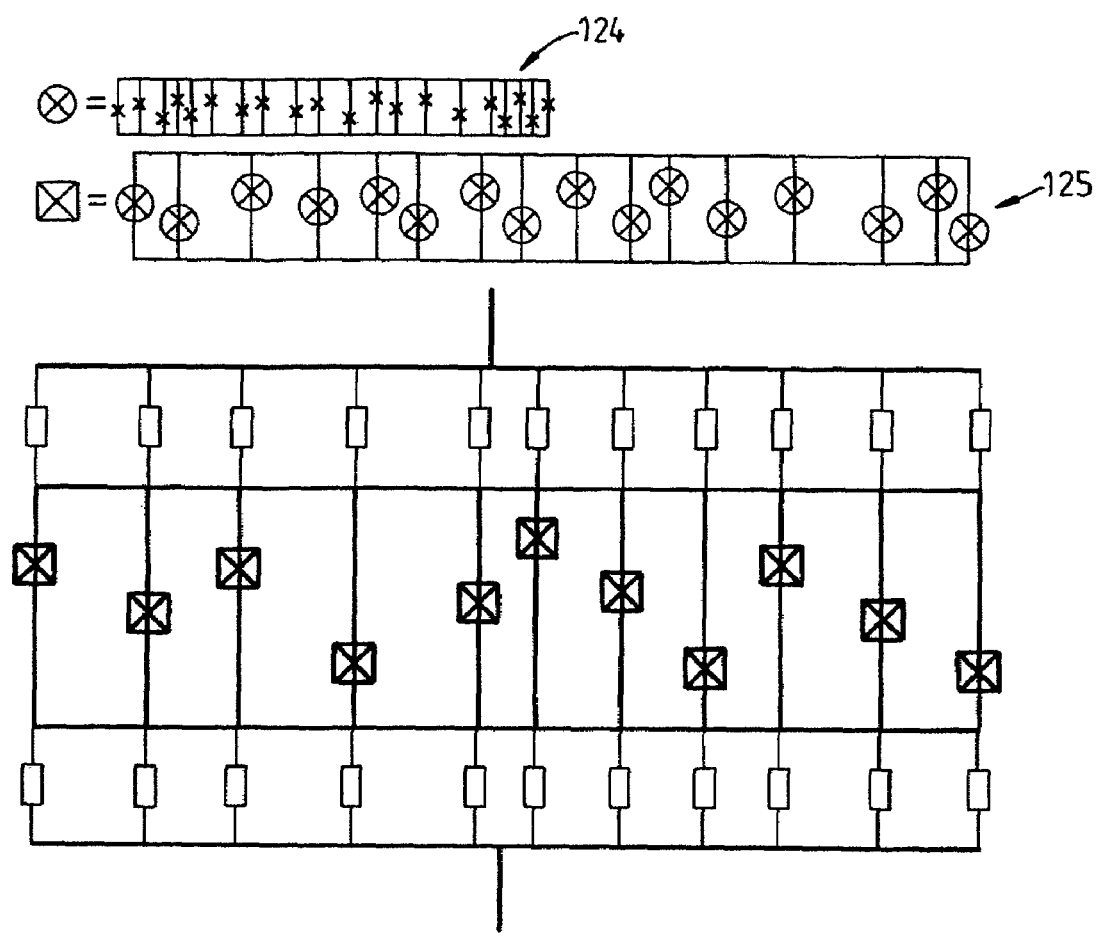
FIG. 16 shows a diagrammatically illustrated networking of SQIF sections.

An exemplary embodiment in which a plurality of SQIF sections 124 are connected in a hierarchically organized SQIF array is shown in FIG. 16. Here, the basic elements of such a hierarchical SQIF array are identical basic SQIFs 124 with an identical structural factor. These basic SQIFs are arranged on a second hierarchical plane in the form, once again, of a SQIF 125, which serves anew as a basic SQIF 125 for a third hierarchical plane. Arrangements with more than three hierarchical planes (k=1, 2, 3, . . . ) are also possible. The advantage of such arrangements resides in the fact that, depending on the relationships between the oriented surface elements of the basic SQIF and the SQIF or SQIFs of higher hierarchical planes, and as determined by the generally different structural factors on the various planes, the interference patterns which are produced on the various planes once again interfere to form an overall pattern, and this renders possible an extremely high resolution. Since the oriented surface elements $\vec{a}_m$ in the various hierarchical planes can be differently aligned, the resulting interference pattern is, moreover, extremely sensitive with reference to the direction of the external field. According to the current state of production engineering, such SQIF systems of multidimensional design cannot be implemented on-chip. However, it is possible to produce the individual planar components of a multidimensional SQIF system with the aid of conventional methods of thin-film technology, and then to connect said components with the aid of superconducting twisted-pair cables such that an overall system of the type described is produced. Such superconducting twisted-pair cables have the advantage in this case that no effective flux penetrates into them. The connection of different parts of a SQIF system with the aid of such superconducting twisted-pair cables therefore has no influence on the serviceability of the overall SQIF, since the cable featured in Equation 6 only features as an oriented surface element with a vanishingly small area.

Figure 17A:
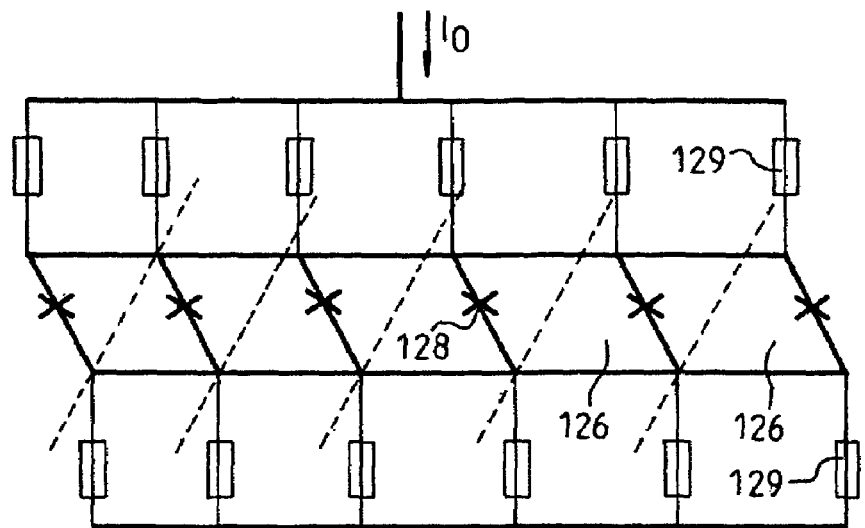
FIGS. 17a to c show diagrammatically illustrated, flat, superconducting quantum interference filters with a geometrical arrangement for minimizing the influence of self-fields.
Figure 17B:
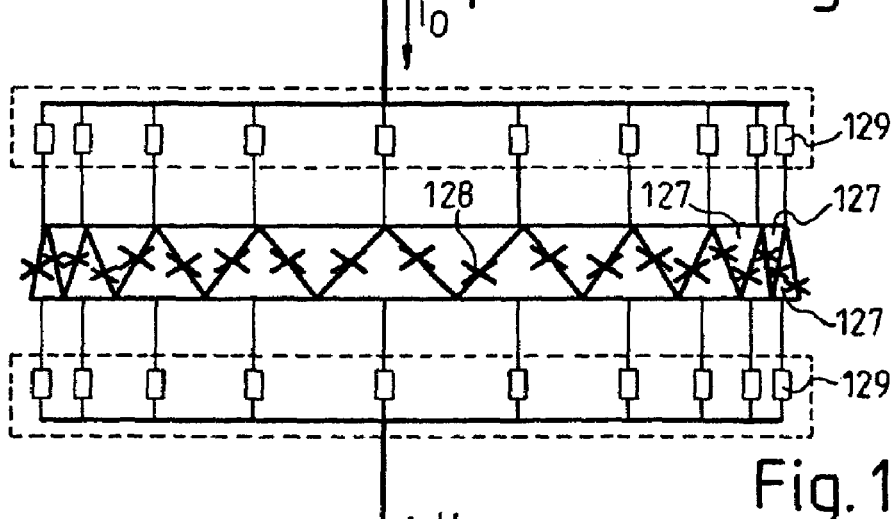
Figure 17C:
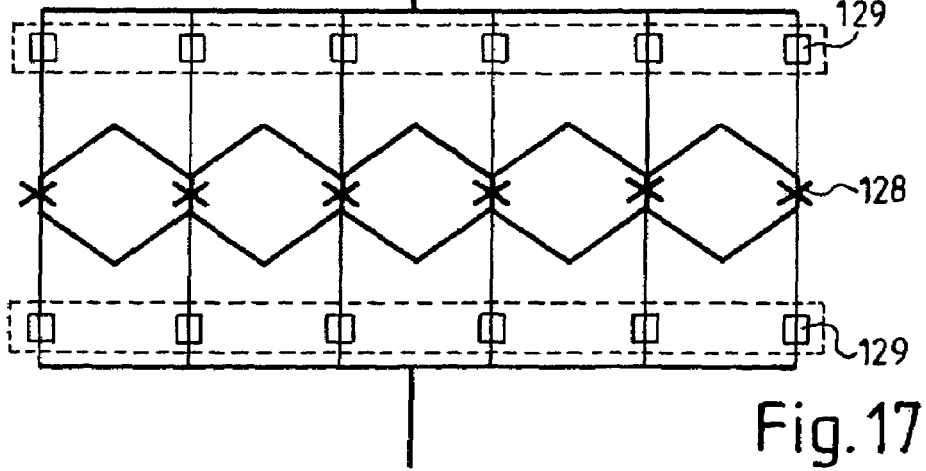

An exemplary embodiment of a SQIF, which shows how the inductive couplings active between different network cells can be minimized, is illustrated in FIG. 17a. Such inductive couplings can reduce the sensitivity of the device when the network comprises very many cells. Since a supercritical current flows through each contact, the resulting current distribution in this case produces a self-field which, under some circumstances, however, cannot be neglected. The embodiments according to the invention as illustrated, for example, in FIG. 17b can be used to reduce the influence of the self-fields sharply. The conductor tracks of the network cells 126, 127 are designed in FIGS. 17a and 17b such that the current flowing through a network junction 128 induces only a negligible flux in the respectively next but one network cell, since the magnetic field of a short current-carrying conductor piece is substantially limited to a region perpendicular to the conductor piece. Since, for $\Phi=0$, each junction is flowed through by a current of the same strength, in this case all inductances vanish, and the global minimum of the voltage response function corresponds to that according to Equation 8. In order to minimize the self-fields of the feeder and outgoing lines, the driver current $I_0$ is fed and led off again through busbar resistors 129 which correspond to the prior art and whose distance from the network can be selected to be sufficiently large. An alternative design of a SQIF which likewise minimizes the mutual inductive influences is illustrated in FIG. 17c.

Figure 18:
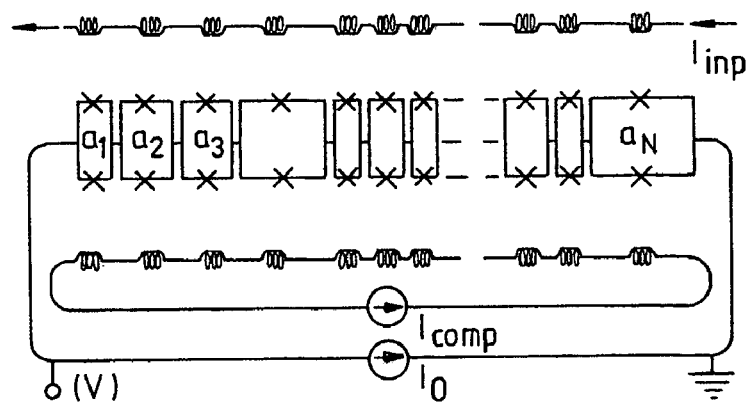
FIG. 18a shows a network made from cells connected in series.
FIG. 18b shows a voltage response function corresponding to a network in accordance with FIG. 18a, in the case of a series circuit for N=100 cells.
FIG. 18c shows a current-voltage characteristic of a network in accordance with FIG. 18a, when it is operated as a current amplifier with the aid of a compensation circuit.
Figure 18:
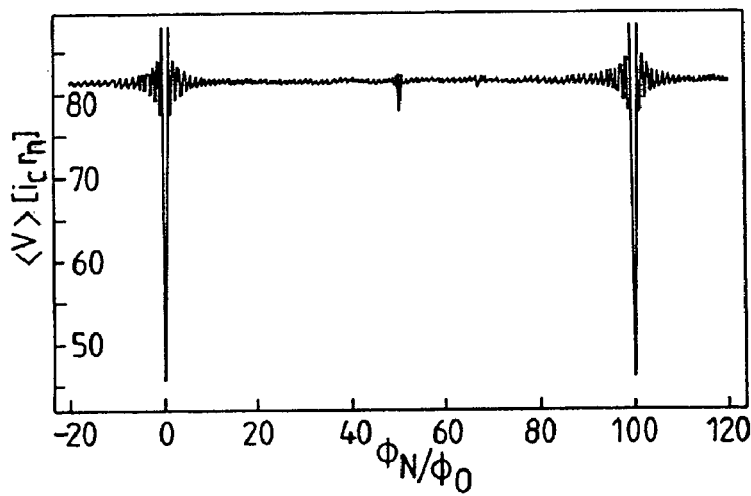
Figure 18:
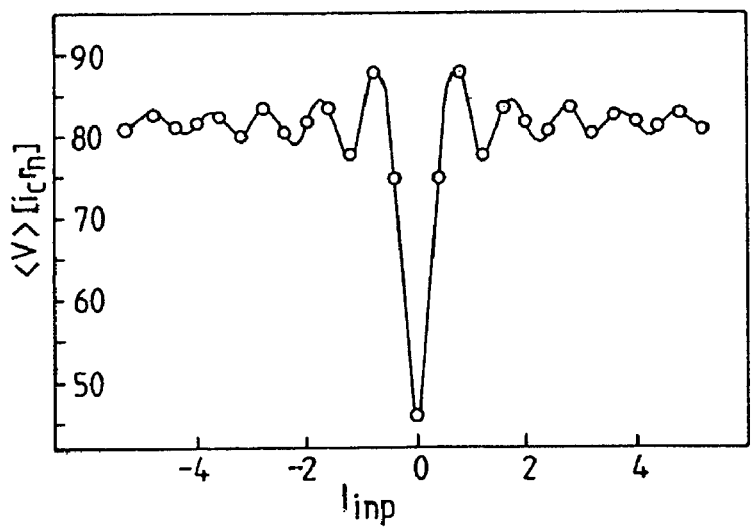

An exemplary embodiment in which the various network cells are connected in series is illustrated in FIG. 18a. The oriented surface elements $\vec{a}_m$ are also selected here such that the voltage response function of the network is not periodic, or only has a period which is very large in comparison with $\Phi_0$. In the case of a non-periodic voltage response function, the global absolute minimum of this voltage response function is at exactly $\vec{B}=0$. A typical voltage response function of a series circuit for N=100 network cells $a_1$ to $a_{100}$ and a very large period is illustrated in FIG. 18b.

Such designs have the advantage that the series circuit causes the voltage response functions of the individual network cells to add together. This produces a quantum interference filter with a very large voltage range which can enter the range of a plurality of mV or even V. By contrast with the parallel circuits, however, in this case there is no reduction in the width of the voltage response function (variance) by $\vec{B}=0$ as compared with conventional two-junction SQUIDs. However, since the spacing between adjacent network loops in series arrangements can be selected at will, without infringing the quantum interference condition, the parasitic mutual inductances can be minimized with the aid of such arrangements. Moreover, series circuits can have technically conditioned advantages in production. In particular, an increased packing density is possible, and this can be advantageous in the integration of circuits on a chip.

The theoretical description of series SQIFs can be done with the aid of Equation 8, since a series SQIF constitutes the simplest realization of a two dimensional SQIF array. For identical network junctions, the mean DC voltage dropping across an individual network cell is given for a supercritical driver current $I_0>2i_c$ by $$\langle V \rangle_n = i_c r_n \sqrt{\left(\frac{I_0}{2i_c}\right)^2 - \left|\cos\left(\pi\frac{\Phi_n}{\Phi_0}\right)\right|^2} \qquad (9)$$

in which it holds that $\Phi_n=(\vec{B},a_n)$. The mean DC voltage $\langle V \rangle$ dropping across the overall series array results from $$\langle V \rangle = \sum_{n=1}^{N} \langle V \rangle_n \qquad (10)$$

It is certainly true that because of the series arrangement of the network cells $\vec{a}_n$ a structural factor cannot, as for the parallel arrangement, be defined directly by the appropriate selection of the sequence $\{\vec{a}_n\}$, but it is also possible here to set the profile of the voltage response function and, in particular, the measuring and/or operating range.

In the exemplary embodiment of FIG. 18b, for example, the oriented surface elements $\vec{a}_n$ were selected in a flat series arrangement corresponding to the arithmetic relationship $$a_n = \frac{n}{N} a_N \qquad (11)$$

in which case it holds that $\vec{a}_n=|\vec{a}_n|$, and $a_N$ denotes the largest area of the series SQIF with N network cells and 2N contacts. Such a selection has the advantage, for example, that the maximum of the voltage response function follows directly on the minimum (compare FIG. 18b), and so the voltage range becomes a maximum.

In addition to the series SQIF, a typical coupling and control circuit is drawn in diagrammatically in FIG. 18a. Given an appropriate design, a magnetic compensation field which compensates an external field and/or the field which is produced by the current $I_{inp}$ is produced by the compensation current $I_{comp}$ at the location of the individual network cells. This permits the operation of the SQIF in extremely sensitive nulling mode. In this case, the current $I_{inp}$ is, for example, the input current of a pick-up loop or of another signal source.

Series SQIFs can also therefore be greatly advantageous, because the background noise of the circuit, for example when it is being used as a (current) amplifier, rises only in proportion to $\sqrt{N}$, whereas the voltage range grows in proportion to N. This is the case because the voltage noise of the various network cells, and/or of the Josephson junctions in these cells, is not correlated (pure current coupling), and is therefore superimposed only incoherently. Consequently, extremely low-noise amplifiers, for example, can be implemented using series SQIFs or, in general, SQIF arrays. A typical current-voltage characteristic of such an amplifier component, which can be implemented by means of a SQIF, is illustrated in FIG. 18c. Depending on the design of the SQIF, it is also possible to detect and/or amplify very small currents ($<10^{-12}$ A) in this operating mode. Further advantages of such amplifier components are their very fast switching times and that they can be used up to very high frequencies.

The periodicity characteristics of the voltage response function are an essential feature of SQIFs. The frequency spectrum of the voltage response functions of SQIFs with reference to the magnetic flux is therefore clearly different from conventional SQUID interferometers. This state of affairs is illustrated in FIGS. 19a to 19d with the aid of typical frequency spectra of SQUIDs (FIGS. 19a and 19b) and of SQIFs (FIGS. 19c and 19d).

Figure 19A:
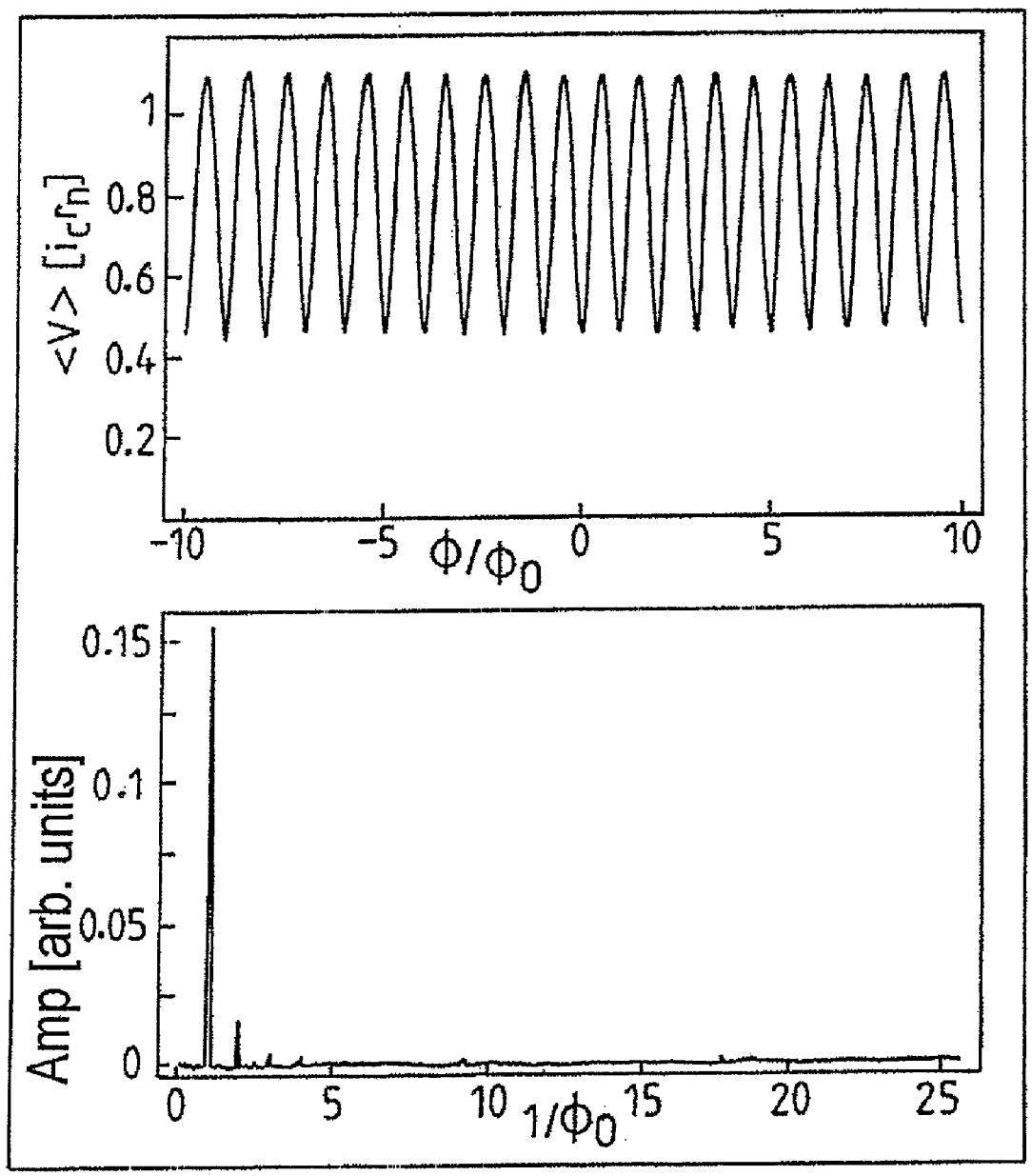
FIG. 19a shows, in the top picture, the typical voltage response function of a conventional SQUID with the associated frequency spectrum in the bottom picture.
Figure 19B:
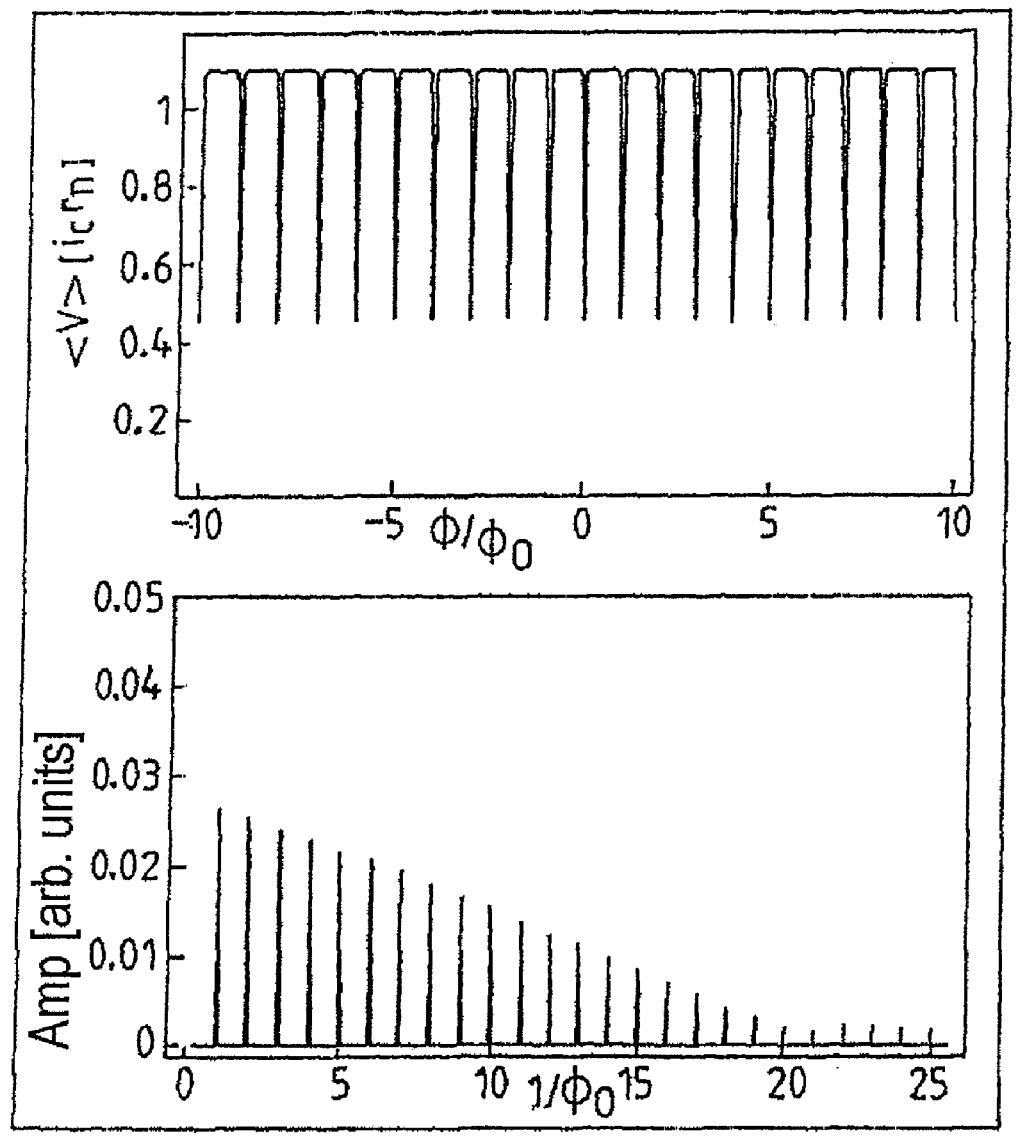
FIG. 19b shows, in the top picture, a typical voltage response function of a network made from identical cells, and the associated frequency spectrum in the bottom picture.
Figure 19C:
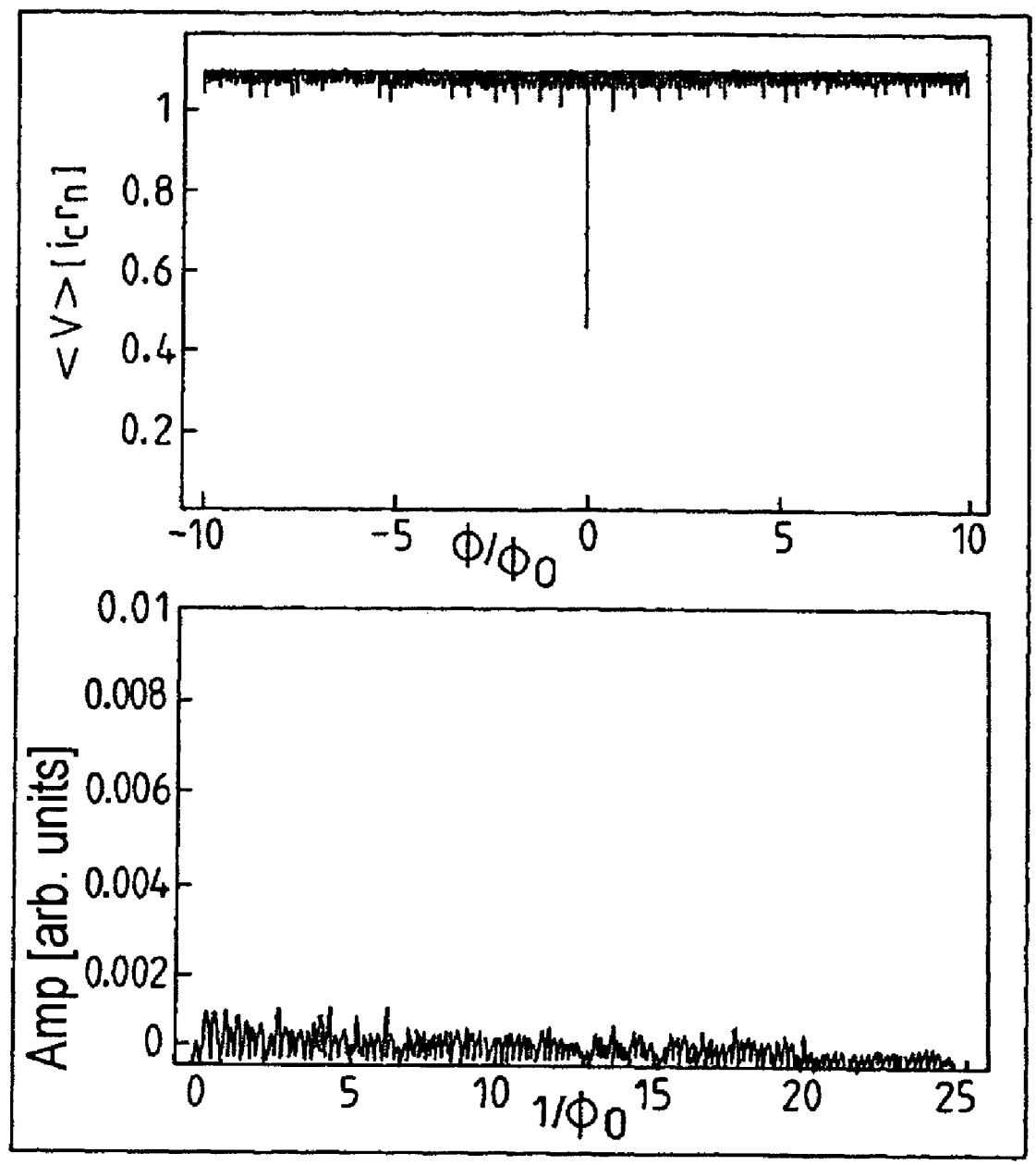
FIG. 19c shows, in the top picture, the voltage response function of a superconducting quantum interference filter without periodicity, and the associated spectrum in the bottom picture.
Figure 19D:
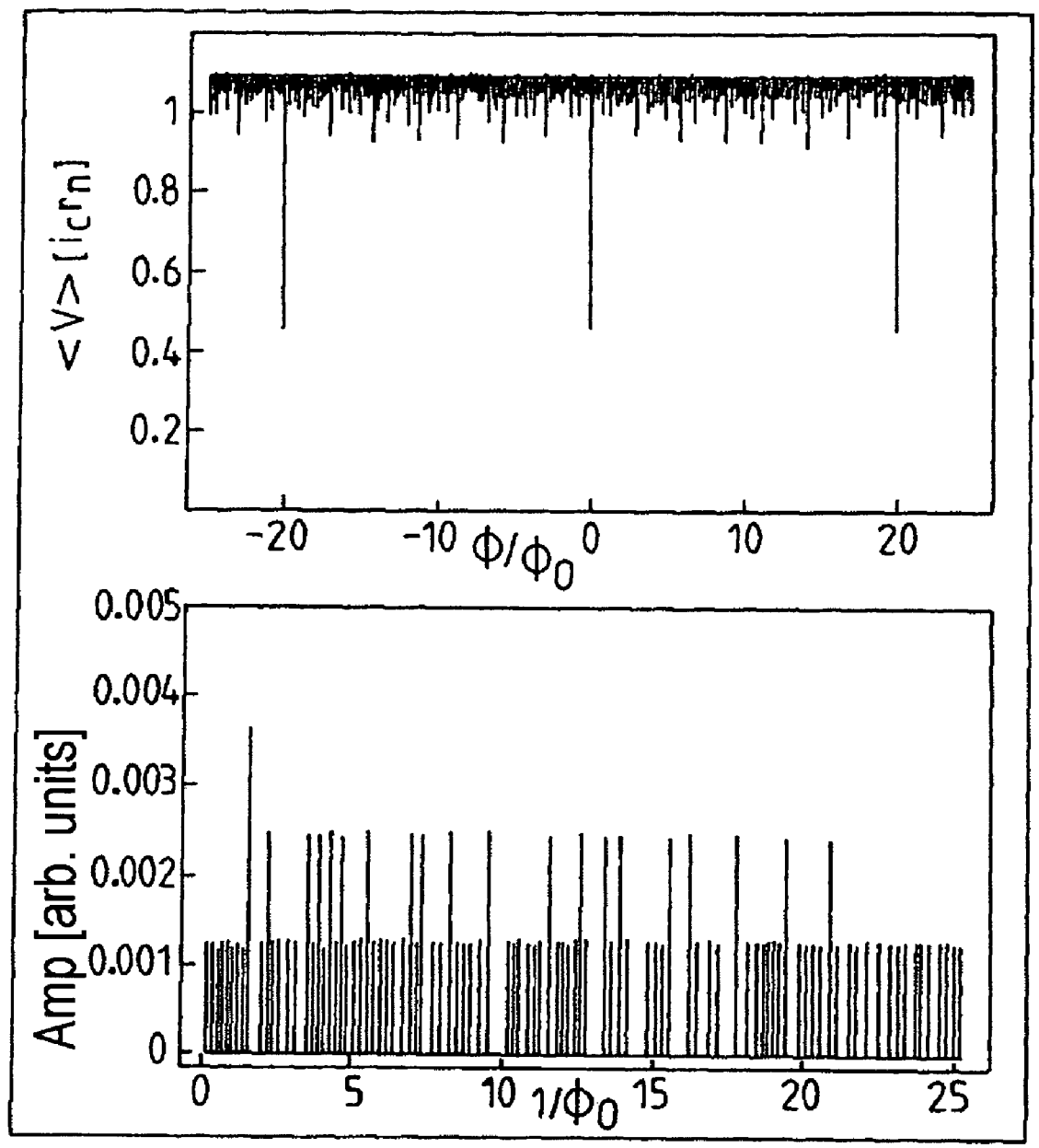
FIG. 19d shows, in the top picture, a voltage response function and, in the bottom picture, the associated spectrum of a quantum interference filter which has a technically conditioned, comparatively large periodicity.

FIG. 19a shows in the top picture the typical voltage response function of a conventional SQUID. The $\langle V(\Phi) \rangle$ curve is periodic with the period $\Phi_0$. The associated frequency spectrum in the bottom picture of FIG. 19a therefore shows an amplitude which is decisively dominant at 1 $\Phi_0$. Since the voltage response function of a SQUID is not harmonic (compare Equation 8), yet higher harmonic modes also occur at $2\Phi_0$ and $3\Phi_0$, but they have only a very small amplitude. The frequency spectrum of conventional SQUIDs is therefore dominated by the $\Phi_0$-periodic contribution. As FIG. 19b shows, this is also the case with multiloop arrangements which are constructed from identical network cells, and this is so independently of whether series arrangements or parallel arrangements of identical SQUID loops are involved. In the case of parameter imperfections or geometrical imperfections, as well, quantum interferometers corresponding to the prior art always exhibit a discrete frequency spectrum which is dominated by the $\Phi_0$-periodic contribution. In addition, in the case of imperfections all that can occur is an additional continuous spectrum which stems from the imperfections and depends on the type of the imperfections.

By contrast, quantum interference filters have no dominant $\Phi_0$-periodic contribution in the frequency spectrum of their voltage response functions. This state of affairs is illustrated in FIGS. 19c and 19d. The frequency spectra in FIGS. 19a to 19c (bottom pictures) are plotted in the respectively identical arbitrary units such that direct comparison is possible. The voltage response and the associated frequency spectrum of a quantum interference filter, which does not exhibit periodicity, is shown in FIG. 19c. The spectrum is virtually continuous and no discrete spectrum exists. In particular, there is no significant $\Phi_0$-periodic contribution. The amplitudes of the virtually continuous spectrum are smaller by two or one order of magnitude than in the case of conventional arrangements according to FIG. 19a or FIG. 19d. Illustrated in FIG. 19d is the voltage response function and the associated spectrum of a quantum interference filter, which exhibits a technically induced periodicity. The voltage response function has the property that its period is very much larger than $\Phi_0$, and the frequency spectrum has a discrete component with a very small amplitude at the period $\Phi_0$. This amplitude in the case of the period $\Phi_0$ is not significant and in any case does not supply a dominant contribution to the frequency spectrum. Moreover, the discrete spectrum is distinguished, in turn, in that its amplitudes are smaller by one to two orders of magnitude by comparison with the conventional arrangements.

The frequency spectra of the quantum interference filters are robust with regard to the $\Phi_0$-periodic contribution of the frequency spectrum. Parameter imperfections or geometrical imperfections do not change the abovedescribed qualitative characteristics of the arrangements.

Figure 20:
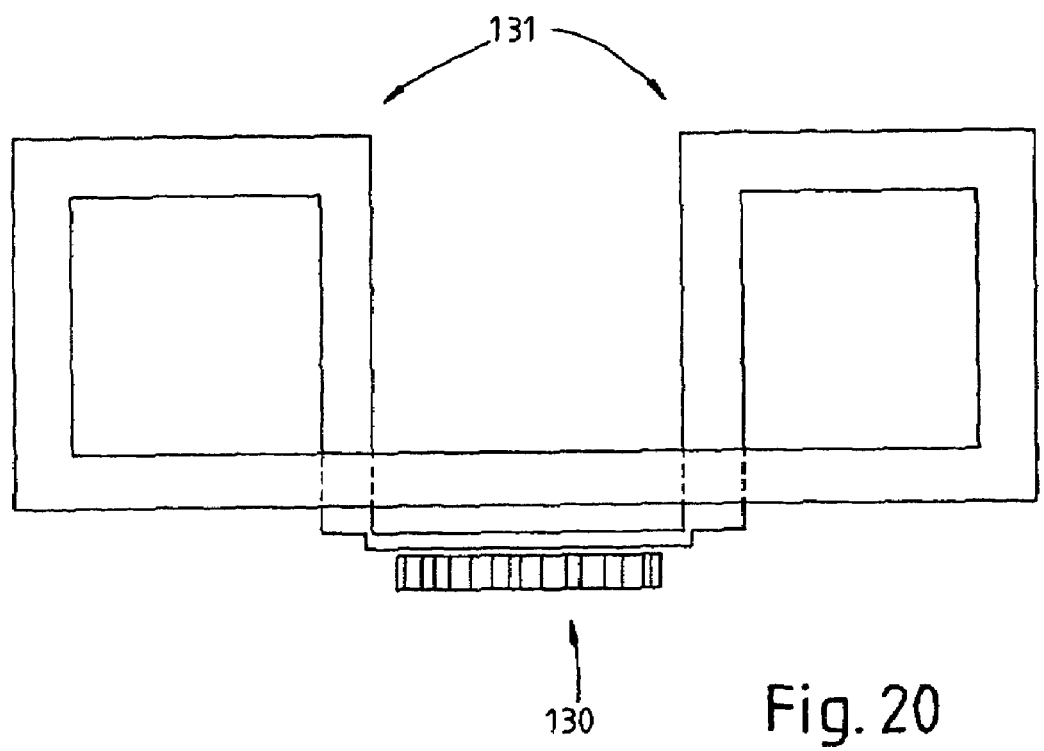
FIG. 20 shows a diagrammatically illustrated, flat superconducting quantum interference filter with a superconducting pick-up loop which amplifies the primary magnetic field at the location of the filter.

Illustrated diagrammatically in FIG. 20 is an exemplary embodiment of a flat SQIF 130 which is provided with a superconducting pick-up loop. Such pick-up loops amplify the primary magnetic field by outwardly displacing the flux produced in their interior by this field. Such devices have the advantage that the primary magnetic field can be very strongly amplified at the location of the SQIF by means of a suitable arrangement. A further advantage of SQIFs consists in that the total area of SQIFs can be designed so as to minimize the impedance mismatching between the pick-up loop and SQIF. The sensitivity and the resolution of SQIFs can be substantially enhanced by such devices. Instead of a pick-up loop, it is also possible to use superconducting surfaces (so-called washers) which likewise lead to the named advantages. The coupling of a gradiometer loop is also possible and leads to the named advantages in the measurement of magnetic field gradients. Suitably designed superconducting pick-up loops are likewise advantageous in the detection of time-variant electromagnetic fields, since they can simultaneously serve as receiving antennas.

We claim:

1. An antenna for radio-frequency electromagnetic waves, comprising:
   normally conductive and/or superconducting electrical circuitry with one or more active components, the active components comprising at least one transistor, which is suitable for use at low temperatures;
   a primary antenna structure;
   means for supplying the circuitry with electrical power;
   means for supplying the circuitry with a control current and/or a control voltage;
   means for emitting an electromagnetic wave from the circuitry;
   an active cooler which can extract heat from at least a part of the circuitry during operation; and
   a vacuum vessel which contains at least a part of the circuitry and at least a part of the primary antenna structure and by means of which this part can be thermally isolated from the surrounding area,
   wherein the vacuum vessel contains a cooling finger of the active cooler,
   wherein the cooling finger is thermally coupled to at least one normally conductive and/or superconducting waveguide termination of the primary antenna structure,
   wherein the active components are thermally coupled to the cooling finger,
   wherein the active components are electromagnetically coupled to the waveguide termination,
   wherein the vacuum vessel has a window through which electromagnetic waves can pass and is geometrically designed such that an electromagnetic wave can be fed into the waveguide termination, and
   wherein the active cooler is designed to cool at least a part of the circuitry below a low temperature of 150 Kelvin.

2. The antenna as claimed in claim 1, wherein the normally conductive and/or superconducting electrical circuitry further comprises at least one superconducting quantum interference filter comprising closed superconducting cells, each of which forms a current loop and contains a plurality of Josephsohn junctions,
   wherein at least three of the superconducting cells are connected in a superconducting form and/or not in a superconducting form and in which case current can pass through the contacts of the at least three superconducting cells such that a voltage, which varies over time, is, in each case, dropped across at least two contacts of one cell, the average of the voltage does not disappear over time,
   wherein the at least three superconducting cells are designed to be geometrically different in such a manner that the magnetic fluxes, which are enclosed by the superconducting cells when a magnetic field is present, differ in such a manner that the frequency spectrum of the voltage response function with respect to the magnetic flux does not have a significant $\phi_0$ periodic component, or in such a manner that, if a discrete frequency spectrum exists, the contribution of the $\phi_0$-periodic component of the discrete frequency spectrum is not dominant in comparison to the non- $\phi_0$-periodic components of the discrete frequency spectrum, and
   wherein the superconducting quantum interference filter acts, along with the transistor, as active components.

3. The antenna as claimed in claim 2, wherein electrodes of the superconducting quantum interference filter itself are designed as the primary antenna structures.

4. The antenna as claimed in claim 2, wherein the superconducting quantum interference filter is equipped with an impedance transformer that transforms the impedance of the superconducting quantum interference filter to the impedance of a connected waveguide or a connected consumer.

5. The antenna as claimed in claim 2, wherein the superconducting quantum interference filter is operated in such a way that the part of the electric voltage dropping across the superconducting quantum interference filter which oscillates rapidly with a Josephson relation locks onto a carrier frequency of the incident electromagnetic wave such that the voltage dropping across the superconducting quantum interference filter includes the frequency-modulated signal of the incident electromagnetic wave.

6. The antenna as claimed in claim 2, wherein the superconducting quantum interference filter and the primary antenna structure are applied to a common carrier.

7. The antenna as claimed in claim 2, wherein the superconducting quantum interference filter and the primary antenna structure are applied to separate carriers.

8. The antenna as claimed in claim 2, wherein the superconducting quantum interference filter is applied to one carrier, and the primary antenna structure is applied to another carrier, and the two carriers lie above an other.

9. The antenna as claimed in claim 2, wherein the superconducting quantum interference filter is constructed from grain boundary Josephson junctions, and electrodes of the superconducting quatntum interference filter are composed of high-temperature superconductors.

10. The antenna as claimed in claim 2, wherein the antenna is located on a chip that is fitted on the cooling finger of the active cooler, and in that the antenna signal is derived from said antenna chip with the aid of a poorly thermally conducting waveguide.

11. The antenna as claimed in claim 10, wherein the operating current of the superconducting quantum interference filter is fed and led off by the waveguide.

12. The antenna as claimed in claim 2, further comprising an electronic feedback control with the aid of which the output signal of the superconducting quantum interference filter is fed back to the latter.

13. The antenna as claimed in claim 2, wherein the superconducting quantum interference filter impresses a time-variant voltage on the primary antenna structure such that a time-variant antenna current flows in the primary antenna structure and the primary antenna structure emits an electromagnetic wave.

14. The antenna as claimed in claim 2, characterized in that a portion of the primary antenna structure is composed of at least one of:
 an array of normally conducting and/or superconducting aperture antennas,
 an array of normally conducting and/or superconducting patch antennas,
 one or more electromagnetic lenses,
 one or more horn antennas, and
 one or more parabolic antennas,
whose output signal is assembled via a hollow conductor structure and/or a normally conducting and/or superconducting lead structure and is coupled to at least one of the active components.

15. The antenna as claimed in claim 2, wherein the primary antenna structure is composed of high-temperature superconductors.

16. The antenna as claimed in claim 2, wherein the primary antenna structure is composed of one or an array of antenna rods or other electric conductors whose length or dimensions is/are in the range of half the wavelength of the incident electromagnetic wave.

17. The antenna as claimed in claim 2, wherein the primary antenna structure is composed of one or an array of closed or open loop antennas.

18. The antenna as claimed in claim 2, wherein the primary antenna structure is composed of one or more electrically small antennas.

19. The antenna as claimed in claim 2, wherein the primary antenna structure is also or exclusively composed of dielectric materials.

20. The antenna as claimed in claim 2, wherein the antenna is operated in a resonant cavity that has at a suitable location an opening for the electromagnetic wave incident indirectly or directly.

21. The antenna as claimed in claim 2, wherein the primary antenna structure is equipped with additional filter elements in such a way that one or more frequency bands are selected.

22. The antenna as claimed in claim 2, wherein the antenna includes additional electronic components, in particular electric resistors, capacitors, coils, filter components, transistors or electronic amplifiers.

23. The antenna as claimed in claim 2, wherein the antenna is applied to a substrate by means of microstripline technology such that an electrically conducting base plate forms the counter-electrode.

24. An antenna field having two or more antennas as claimed in claim 2.

25. The antenna field as claimed in claim 24, wherein means are provided with the aid of which the signals of the antennas arranged in the antenna array can be superposed in a phase-sensitive fashion to form an aggregate signal.

26. The antenna as claimed in claim 2, wherein a part of the primary antenna structure further comprises a hollow conductor termination into which there projects at least one elongated antenna element that is electrically insulated from the hollow conductor, and the at least one antenna element is electrically connected to the input of the active components,
 wherein the electrical circuitry includes a plurality of the active components that are connected in series, and
 wherein hollow conductor termination and the part of the electrical circuitry that includes the active components are located in the vacuum vessel, and heat is extracted from the hollow conductor termination and the part of the circuit that includes the active components.

27. The antenna as claimed in claim 26, wherein projecting into the hollow conductor termination are two antenna elements that are fitted offset from one another and that, in each case, are individually electrically connected to the input of the active components such that two independent polarizations are led off from the hollow conductor termination.

28. The antenna as claimed in claim 1, wherein the primary antenna structure further comprises a hollow conductor termination into which there projects at least one elongated antenna element that is electrically insulated from the hollow conductor, and the at least one antenna element is electrically connected to the input of the active components.
 wherein the electrical circuitry includes a plurality of the active components that are connected in series, and
 wherein the hollow conductor termination and the part of the electrical circuitry that includes the active components are located in the vacuum vessel, and heat extracted from the hollow conductor termination and the part of the circuit that includes the active components.

29. The antenna as claimed in claim 28, wherein projecting into the hollow conductor termination are two antenna elements that are fitted offset from one another and that, in each case, are individually electrically connected to the input of the active components such that two independent polarizations are led off from the hollow conductor termination.

30. The antenna as claimed in claim 1, wherein a portion of the primary antenna structure is composed of at least one of:
- array of normally conducting and/or superconducting aperture antennas,
- an array of normally conducting and/or superconducting patch antennas,
- one or more electromagnetic lenses,
- one or more horn antennas, and
- one or more parabolic antennas, whose output signal is assembled via a hollow conductor structure and/or a normally conducting and/or superconducting lead structure and is coupled to at least one of the active components.

31. The antenna as claimed in claim 1, wherein the primary antenna structure is composed of high-temperature superconductors.

32. The antenna as claimed in claim 1, wherein the primary antenna structure is composed of one or an array of antenna rods or other electric conductors whose length or dimensions is/are in the range of half the wavelength of the incident electromagnetic wave.

33. The antenna as claimed in claim 1, wherein the primary antenna structure is composed of one or an array of closed or open loop antennas.

34. The antenna as claimed in claim 1, wherein the primary antenna structure is composed of one or more electrically small antennas.

35. The antenna as claimed in claim 1, wherein the primary antenna structure is also or exclusively composed of dielectric materials.

36. The antenna as claimed in claim 1, wherein the antenna is operated in a resonant cavity that has at a suitable location an opening for the electromagnetic wave incident indirectly or directly.

37. The antenna as claimed in claim 1, wherein the primary antenna structure is equipped with additional filter elements in such a way that one or more frequency bands are selected.

38. The antenna as claimed in claim 1, further comprising additional electronic components, in particular electric resistors, capacitors, coils, filter components, transistors or electronic amplifiers.

39. The antenna as claimed in claim 1, wherein the antenna is applied to a substrate by means of microstripline technology such that an electrically conducting base plate forms the counter-electrode.

40. An antenna field having two or more antennas as claimed in claim 1.

41. The antenna field as claimed in claim 40, further comprising means for the aid of which the signals of the antennas arranged in the antenna array can be superposed in a phase-sensitive fashion to form an aggregate signal.

* * * * *